(12) United States Patent
Jung et al.

(10) Patent No.: US 7,518,666 B2
(45) Date of Patent: Apr. 14, 2009

(54) LIQUID CRYSTAL DISPLAY DEVICE AND FABRICATING METHOD THEREOF

(75) Inventors: Tae Yong Jung, Gumi-si (KR); Ji No Lee, Goyang-si (KR); Hee Young Kwack, Seoul (KR)

(73) Assignee: LG Display Co., Ltd., Seoul (KR)

( * ) Notice: Subject to any disclaimer, the term of this patent is extended or adjusted under 35 U.S.C. 154(b) by 451 days.

(21) Appl. No.: 11/143,657

(22) Filed: Jun. 3, 2005

(65) Prior Publication Data
US 2005/0270434 A1   Dec. 8, 2005

(30) Foreign Application Priority Data
Jun. 5, 2004   (KR)   ................. 10-2004-0041138

(51) Int. Cl.
*G02F 1/1333*   (2006.01)
(52) U.S. Cl. ................. 349/43; 349/44; 349/45; 349/46; 349/47
(58) Field of Classification Search ............. 349/38, 349/43–47
See application file for complete search history.

(56) References Cited

U.S. PATENT DOCUMENTS

| 5,162,933 | A | 11/1992 | Kakuda et al. |
| 5,317,433 | A | 5/1994 | Miyawaki et al. |
| 5,339,181 | A | 8/1994 | Kim et al. |
| 5,462,887 | A | 10/1995 | Gluck |
| 5,668,379 | A | 9/1997 | Ono et al. |
| 5,731,856 | A | 3/1998 | Kim et al. |
| 5,771,083 | A | 6/1998 | Fujihara et al. |
| 5,793,460 | A | 8/1998 | Yang |
| 5,847,781 | A | 12/1998 | Ono et al. |
| 7,019,797 | B2 * | 3/2006 | Choi et al. ............. 349/43 |
| 7,428,032 | B2 * | 9/2008 | Yoo et al. ............. 349/138 |
| 2001/0010567 | A1 * | 8/2001 | Rho et al. ............. 349/43 |
| 2002/0105604 | A1 * | 8/2002 | Ha et al. ............. 349/43 |
| 2002/0109799 | A1 * | 8/2002 | Choi et al. ............. 349/43 |
| 2003/0197182 | A1 * | 10/2003 | Kim et al. ............. 257/72 |
| 2004/0119903 | A1 * | 6/2004 | Chang et al. ............. 349/43 |

FOREIGN PATENT DOCUMENTS

| CN | 1451996 | 10/2003 |
| JP | 6-347825 | 12/1994 |

\* cited by examiner

*Primary Examiner*—David Nelms
*Assistant Examiner*—Thanh-Nhan P Nguyen
(74) *Attorney, Agent, or Firm*—McKenna Long & Aldridge LLP

(57) ABSTRACT

A TFT substrate having a storage capacitor with an increased capacitance and aperture ratio, and a simplified method of fabricating the same, includes gate and data lines crossing each other to define pixel areas; a gate insulating film between the gate and data lines; TFTs connected to the gate and data lines; a semiconductor pattern defining a channel of the TFTs and overlapped by the data lines; a passivation film covering the data lines and the TFTs; and at least one pixel electrode connected to a TFT and provided within a pixel hole that is arranged within a pixel area. The pixel hole is formed through the passivation film and partially through the gate insulating film. Further, a storage capacitor includes a portion of the pixel electrode that overlaps with an underlying gate line with a portion of the gate insulating film that defines the pixel hole.

31 Claims, 24 Drawing Sheets

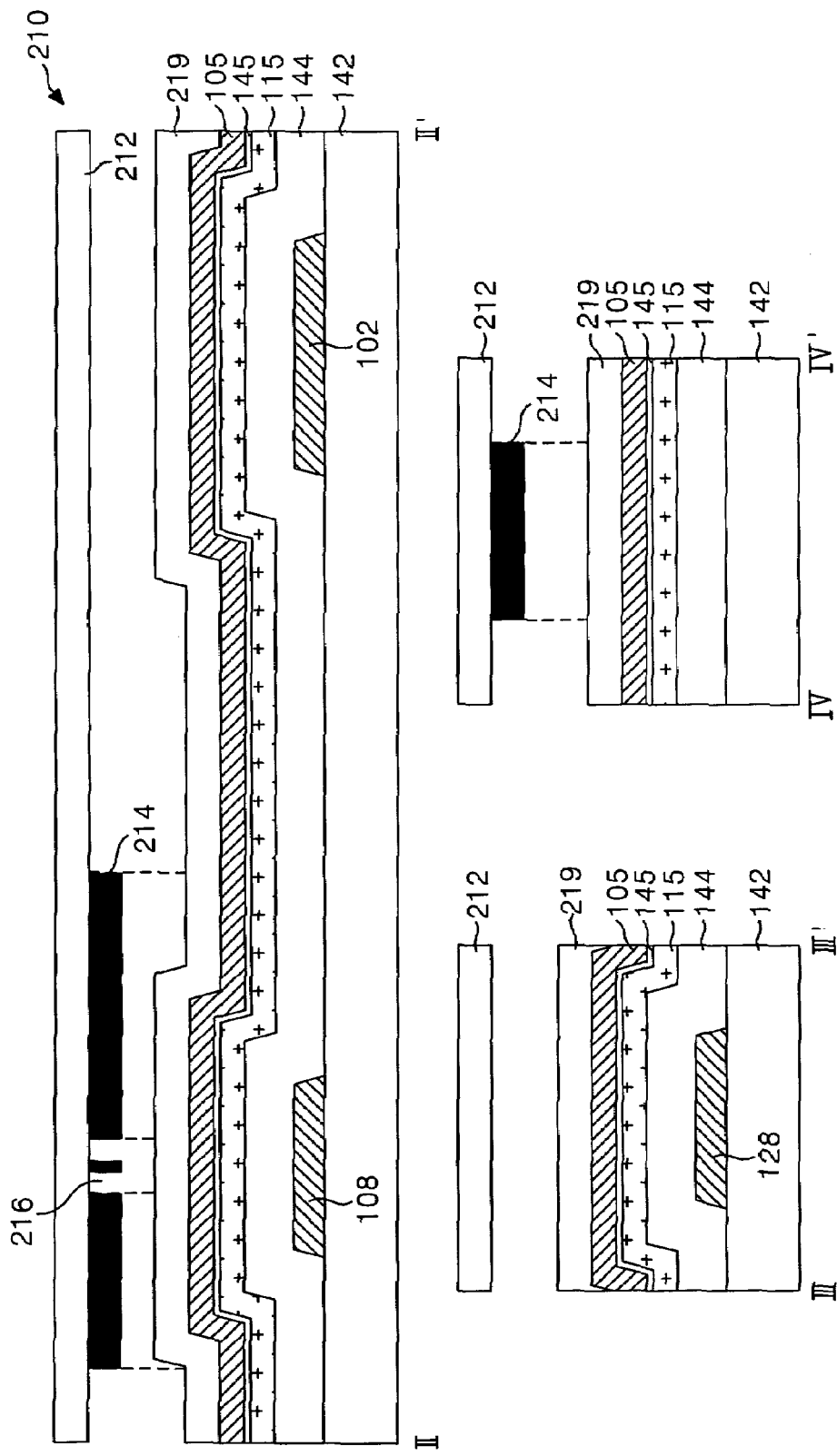

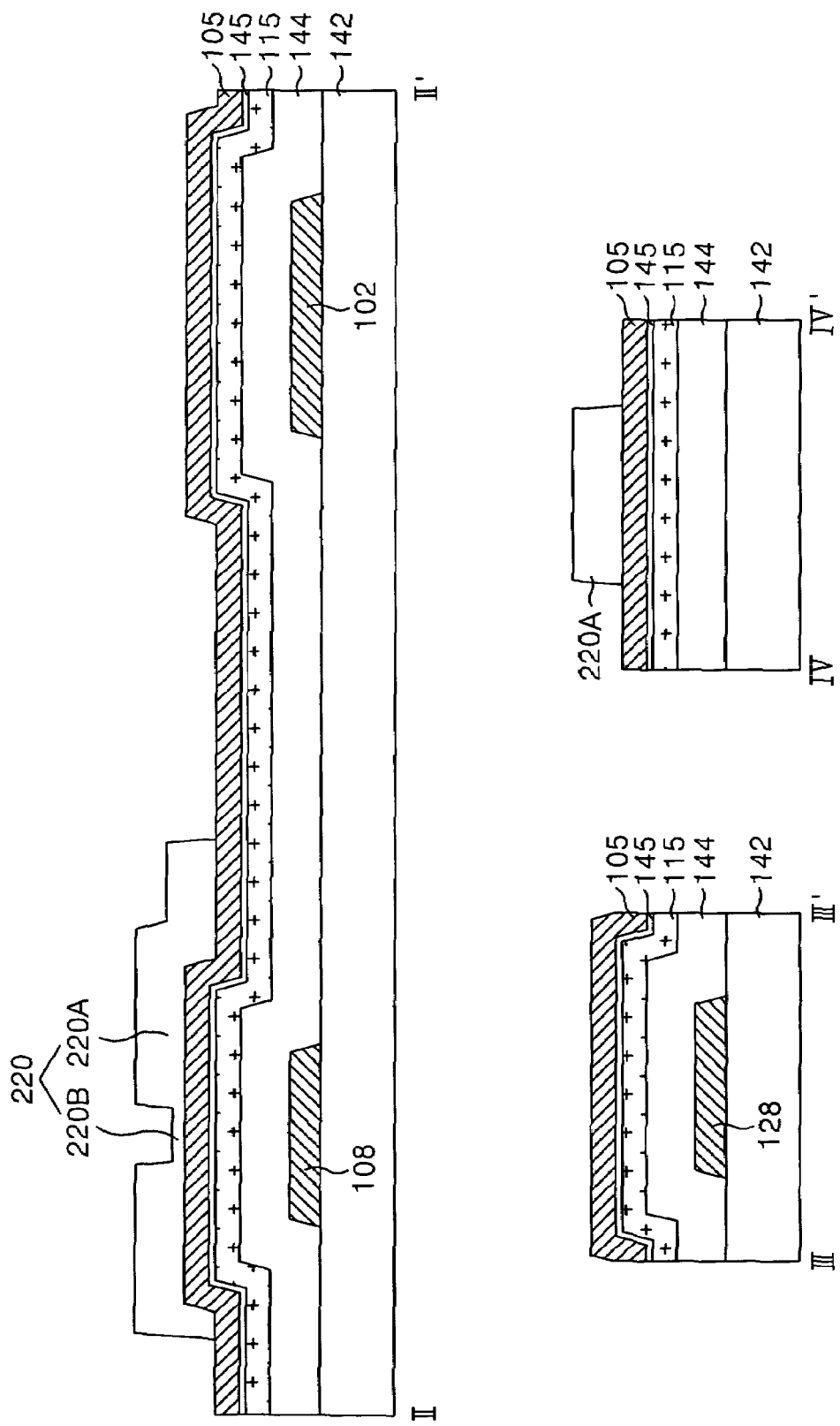

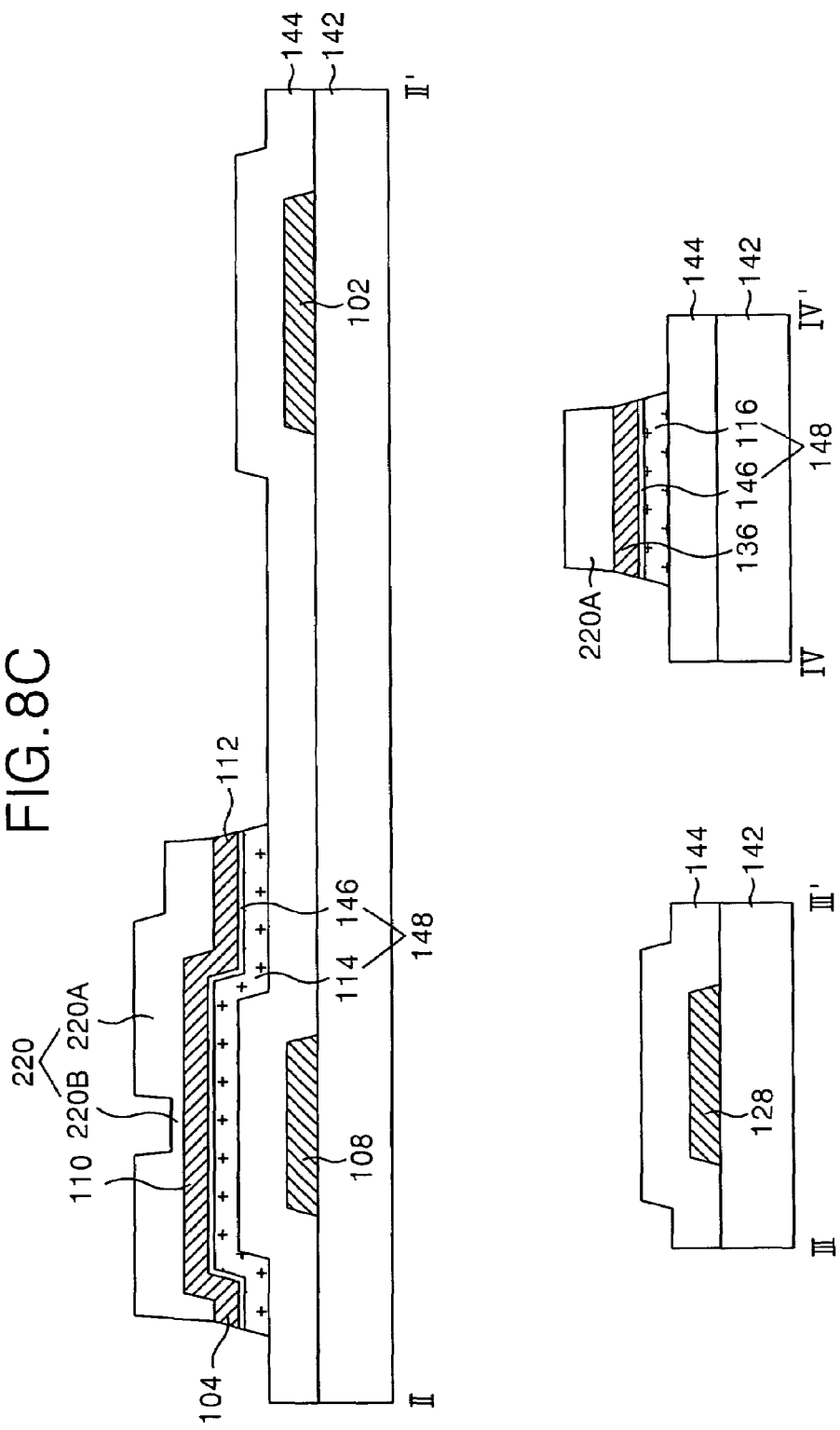

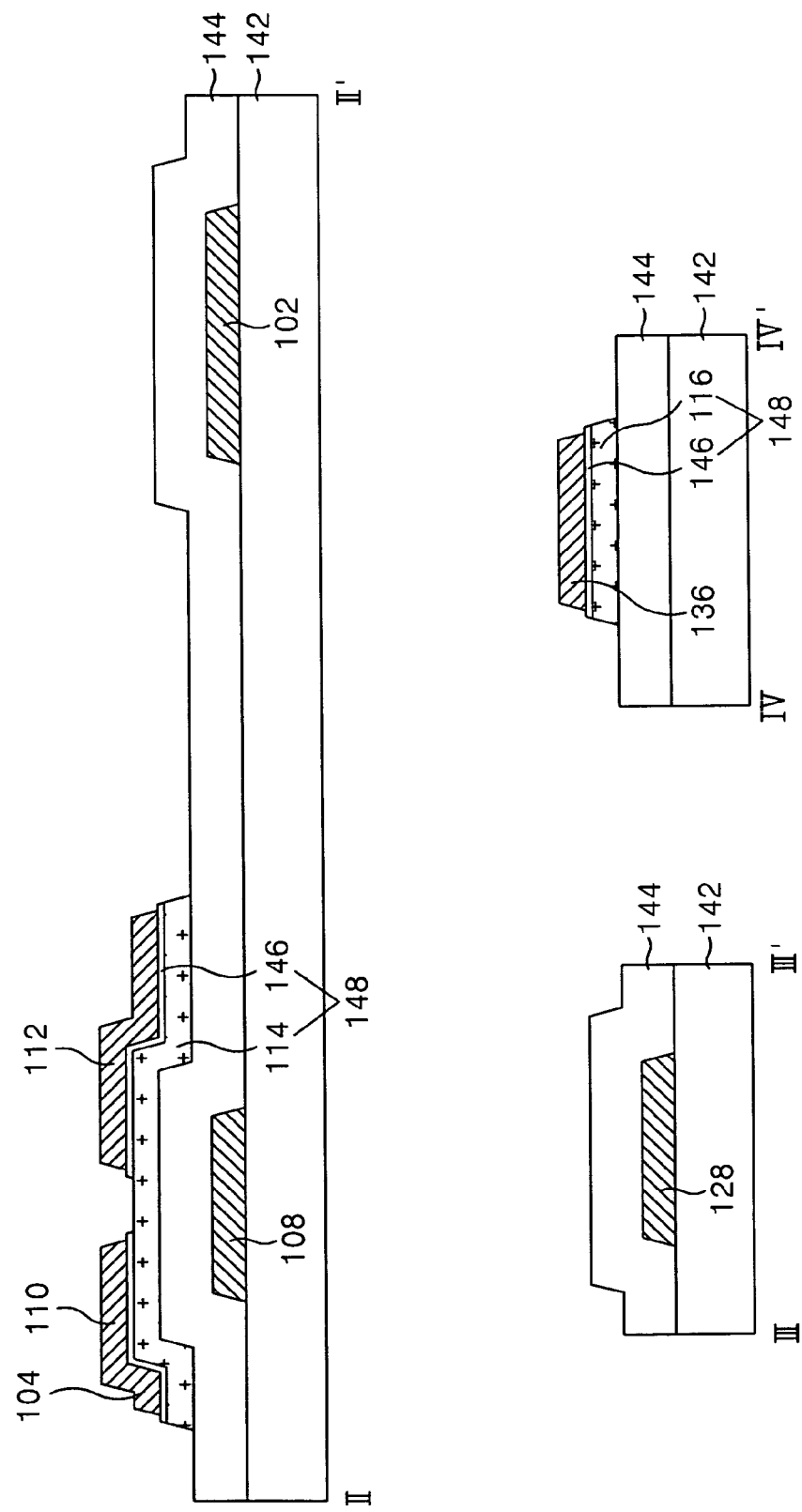

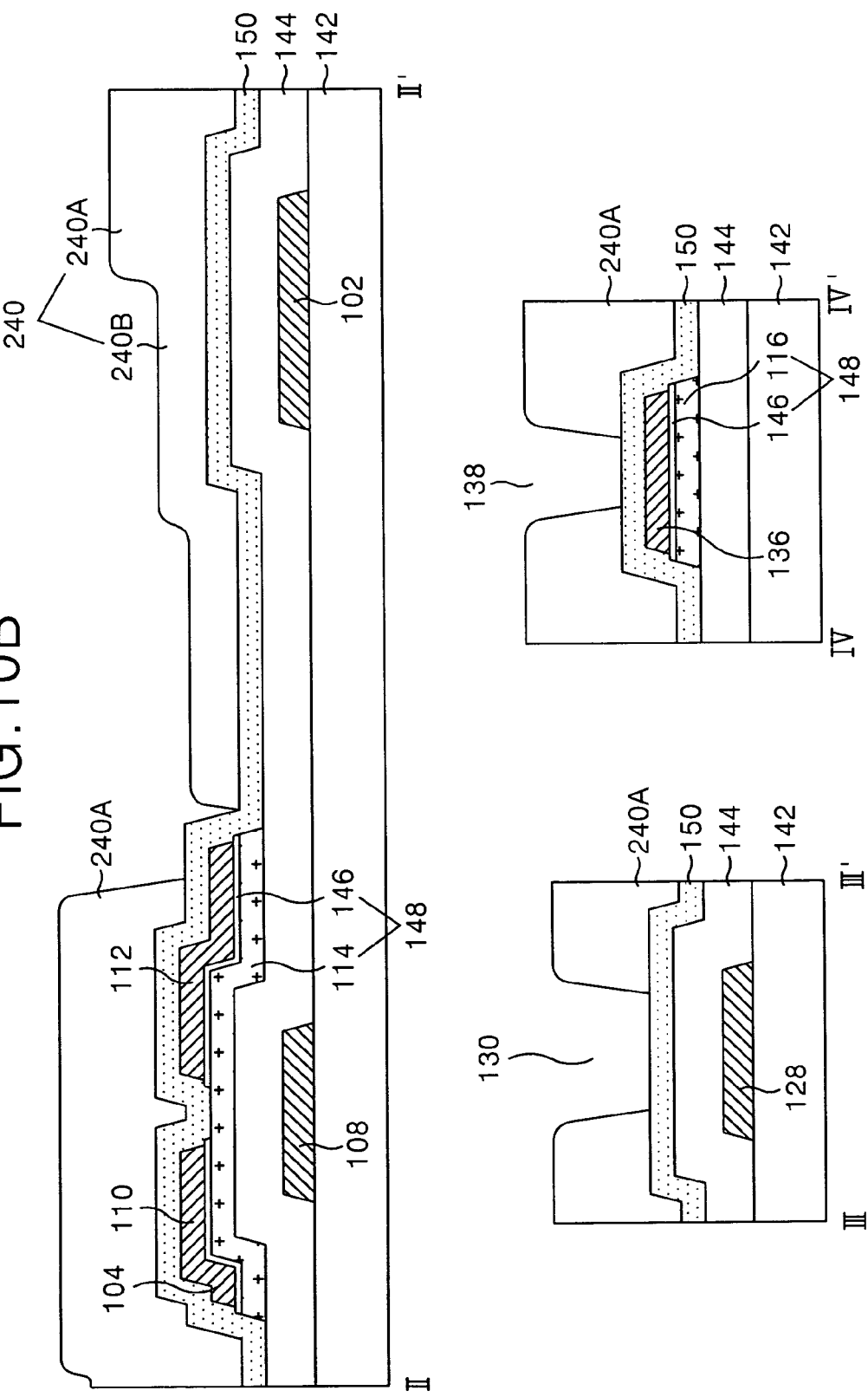

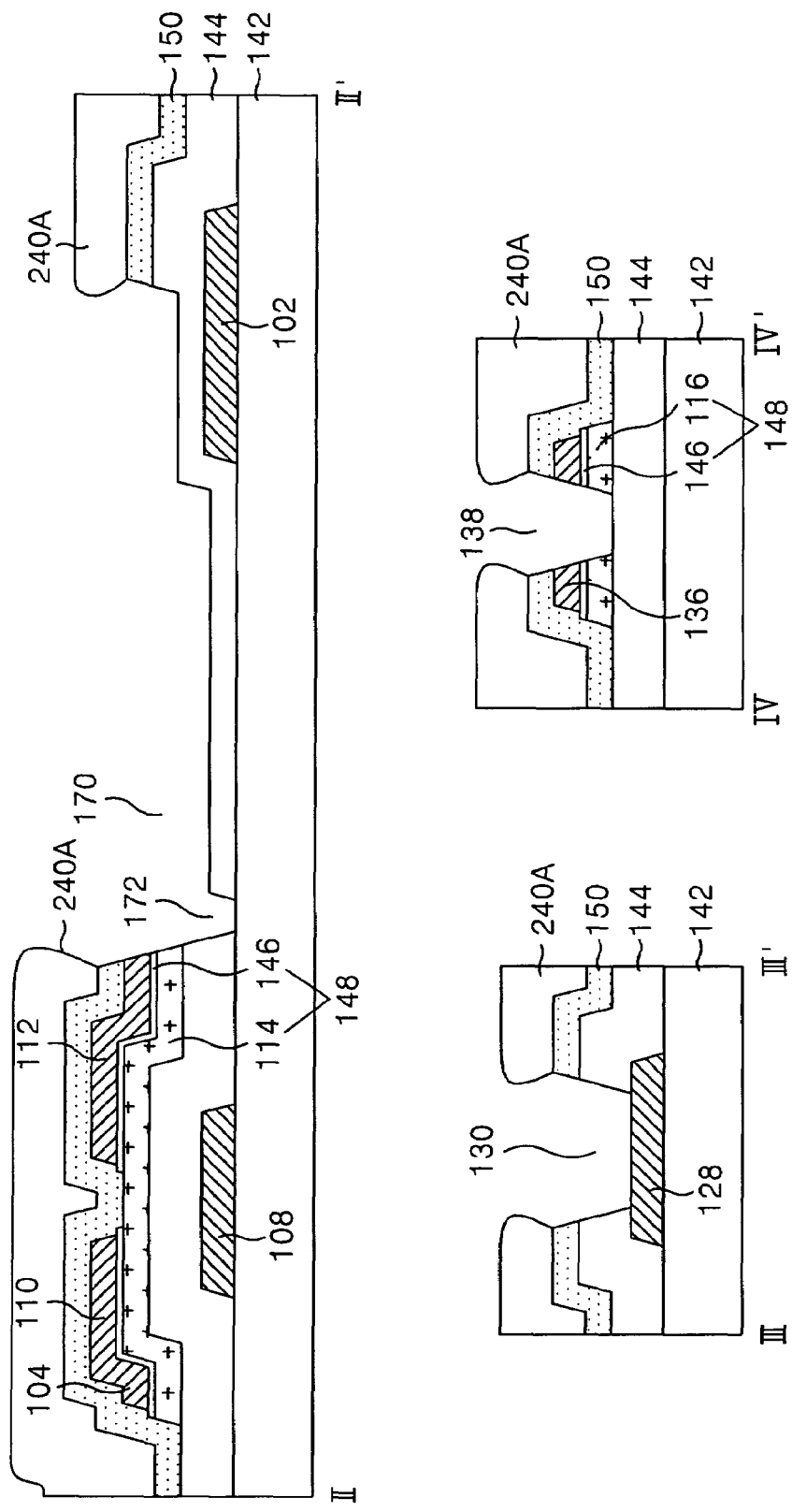

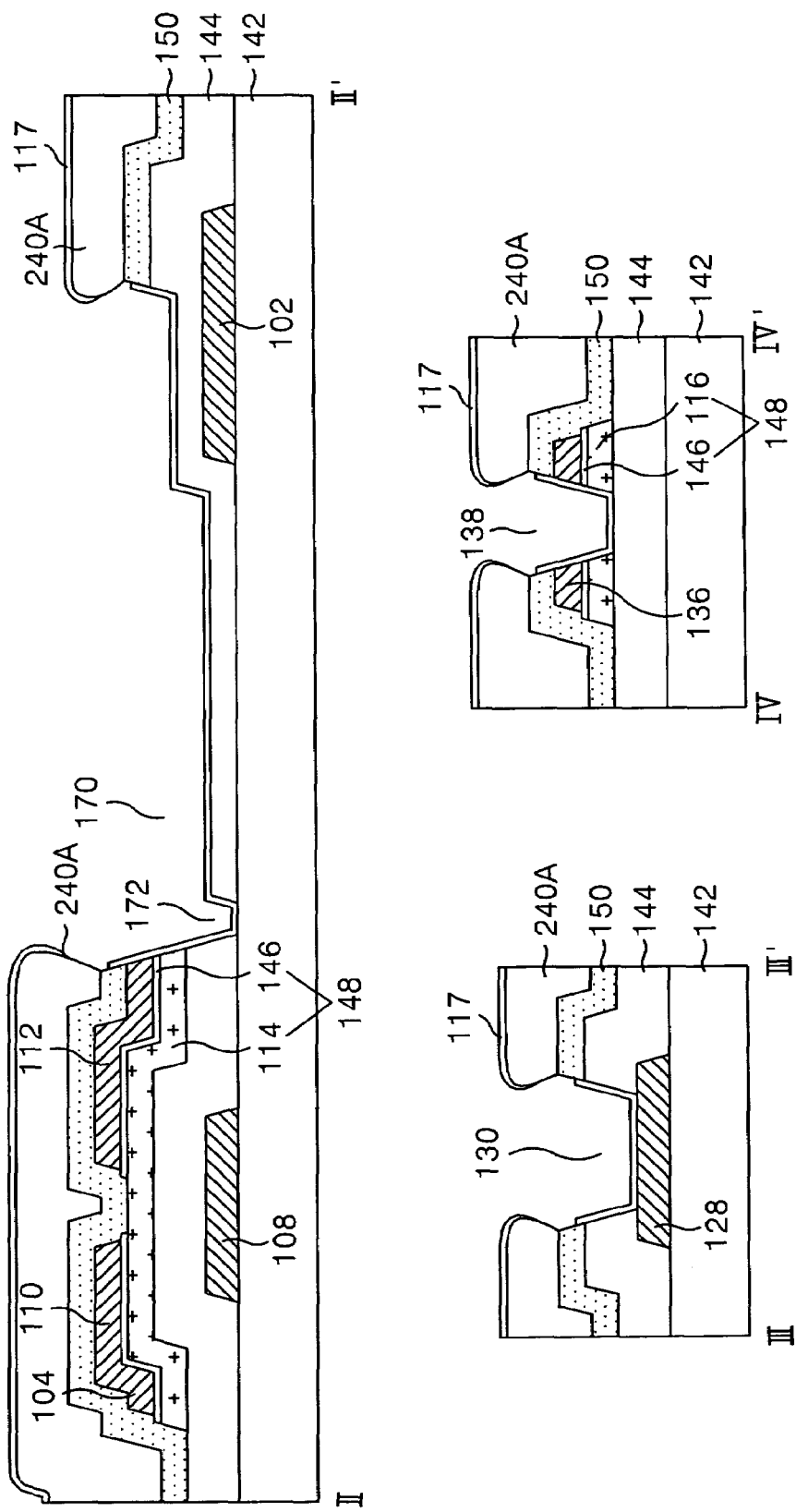

LIQUID CRYSTAL DISPLAY DEVICE AND FABRICATING METHOD THEREOF

This application claims the benefit of Korean Patent Application No. P2004-041138, filed on Jun. 5, 2004, which is hereby incorporated by reference for all purposes as if fully set forth herein.

BACKGROUND OF THE INVENTION

1. Field of the Invention

The principles of the present invention generally relate to liquid crystal display (LCD) devices. More particularly, the principles of the present invention relate to a thin film transistor (TFT) substrate and a simplified method of fabricating the same.

2. Discussion of the Related Art

Generally, LCD devices display pictures by controlling light transmittance characteristics of liquid crystal material via selectively applied electric fields. To this end, LCD devices typically include an LCD panel and driving circuits for driving the LCD panel.

The LCD panel has a plurality of liquid crystal cells arranged in a matrix pattern and generally includes a TFT substrate and a color filter substrate bonded to and spaced apart from the TFT substrates, thereby defining a cell gap between the two substrates. Liquid crystal material is provided within the cell gap as are spacers for maintaining cell gap uniformity.

The TFT substrate includes gate lines, data lines crossing the gate lines to define pixel areas, switching devices (i.e., TFTs) at crossings of the gate and data lines, pixel electrodes formed within the pixel areas and connected to corresponding TFTs, and an alignment film over the pixel electrodes. Each of the gate and data lines include pad portions that are electrically connected to predetermined driving circuits. Accordingly, the gate and data lines receive scanning and pixel signals, respectively, from the driving circuits via corresponding pad portions. In response to scanning signals applied to the gate lines, corresponding TFTs switch pixel signals, transmitted by corresponding data lines, to corresponding pixel electrodes.

The color filter substrate includes a plurality of color filters individually aligned over corresponding pixel electrodes, a black matrix between adjacent color filters for reflecting external light, a common electrode for applying a reference voltage to a subsequently provided liquid crystal layer, and an alignment film over the common electrode.

After the aforementioned TFT array and color filter substrates are prepared, they are bonded together via a sealant material to form a cell gap, liquid crystal material is injected through an injection hole within the sealant material and into the cell gap to form the liquid crystal layer. Subsequently, the injection hole is sealed and fabrication of the LCD panel is complete.

The process used to fabricate the TFT array substrate described above is complicated and relatively expensive because it involves a number of semiconductor processing techniques that require a plurality of mask processes. It is generally known that a single mask process requires many sub-processes such as thin film deposition, cleaning, photolithography, etching, photo-resist stripping, inspection, etc. To reduce the complexity and cost associated with fabricating TFT array substrates, procedures have been developed to minimize the number of masking processes required. Accordingly, a four-mask process has been developed that removes the necessity of a mask process from a standard five-mask process.

FIG. 1 illustrates a plan view of a TFT array substrate of an LCD device, fabricated using a related art four-mask process. FIG. 2 illustrates a sectional view of the TFT array substrate taken along the I-I' line shown in FIG. 1.

Referring to FIGS. 1 and 2, the TFT array substrate includes gate lines 2 and data lines 4 formed so as to cross each other on a lower substrate 42 to define a plurality of pixel areas, a gate insulating film 44 between the gate and data lines 2 and 4, a TFT 6 provided each crossing of the gate and data lines 2 and 4, and a pixel electrode 18 provided at each pixel area. The TFT array substrate further includes a storage capacitor 20 provided at a region where each pixel electrode 18 and a previous gate line 2 overlap, a gate pad 26 connected to each gate line 2, and a data pad 34 connected to each data line 4.

Each TFT 6 allows a pixel signal transmitted by a corresponding data line 4 to be charged and maintained within a corresponding pixel electrode 18 in response to a scanning signal transmitted by a corresponding gate line 2. To this end, each TFT 6 includes a gate electrode 8 connected to a corresponding gate line 2, a source electrode 10 connected to a corresponding data line 4, a drain electrode 12 connected to a corresponding pixel electrode 18, and an active layer 14 overlapping the gate electrode 8 and defining a channel between the source electrode 10 and the drain electrode 12.

The active layer 14 is overlapped by the source and drain electrodes 10 and 12 of each TFT 6, the data lines 4, as well as a lower data pad electrode 36 and a upper storage electrode 22. An ohmic contact layer 48 is formed on the active layer 14 and ohmically contacts the data line 4, the source electrode 10, the drain electrode 12, the lower data pad electrode 36, and the upper storage electrode 22.

Each pixel electrode 18 is connected to a drain electrode 12 of a corresponding TFT 6 via a first contact hole 16 formed through a passivation film 50. During operation, a potential difference is generated between the pixel electrode 18 and a common electrode supported by a color filter substrate (not shown). In the presence of an electric field generated by the potential difference, molecules within the liquid crystal material (which have a particular dielectric anisotropy), rotate to align themselves vertically between the TFT array and color filter substrates. The magnitude of the applied electric field determines the extent of rotation of the liquid crystal molecules. Accordingly, various gray scale levels of light emitted by a light source (not shown) may be transmitted by a pixel area by varying the magnitude of the applied electric field.

Each storage capacitor 20 associated with a pixel area includes a previous gate line 2, an upper storage electrode 22 overlapping with the previous gate line 2 and separated from the previous gate line 2 by the gate insulating film 44, the active layer 14, and the ohmic contact layer 48. A pixel electrode 18 is connected to the upper storage electrode 22 via a second contact hole 24 formed through the passivation film 50. Constructed as described above, the storage capacitor 20 allows pixel signals charged within the pixel electrode 18 to be uniformly maintained until a next pixel signal is charged at the pixel electrode 18.

Each gate line 2 is connected to a gate driver (not shown) via a corresponding gate pad 26. Accordingly, each gate pad 26 consists of a lower gate pad electrode 28 and an upper gate pad electrode 32. The lower gate pad electrode 28 is an extension of the gate line 2 and is connected to the upper gate pad electrode 32 via a third contact hole 30 formed through the gate insulating film 44 and the passivation film 50.

Each data line 4 is connected to a data driver (not shown) via a corresponding data pad 34. Accordingly, each data pad 34 consists of a lower data pad electrode 36 and an upper data pad electrode 40. The lower data pad electrode 36 is an extension of the data line 4 and is connected to the upper data pad electrode 40 via a fourth contact hole 38 formed through the passivation film 50.

Having described the TFT array substrate above, a method of fabricating the TFT array substrate according to the related art four-mask process will now be described in greater detail with reference to FIGS. 3A to 3D.

Referring to FIG. 3A, a gate metal pattern, including the gate line 2, the gate electrode 8, the lower gate pad electrode 28, is formed on the lower substrate 42 in a first mask process.

Specifically, a gate metal layer is formed over the entire surface of the lower substrate 42 via a deposition technique such as sputtering. The gate metal layer may have a single- or double-layered metal structure including chromium (Cr), molybdenum (Mo), an aluminum (Al) group metal, etc. After being deposited, the gate metal layer is patterned using photolithography and etching techniques in conjunction with a first mask pattern to provide the aforementioned gate metal pattern.

Referring next to FIG. 3B, a gate insulating film 44 is coated over the entire surface of the lower substrate 42 and on the gate metal pattern. In a second mask process, a semiconductor pattern and a data metal pattern are provided on the gate insulating film 44. The semiconductor pattern consists of the active layer 14 and the ohmic contact layer 48. The data metal pattern consists of the data line 4, the source electrode 10, the drain electrode 12, the lower data pad electrode 36, and the upper storage electrode 22.

Specifically, the gate insulating film 44, a first and a second semiconductor layer, and a data metal layer are sequentially formed over the surface of the lower substrate 42 and on the gate metal pattern by deposition techniques such as plasma enhanced chemical vapor deposition (PECVD) and sputtering. The gate insulating film 44 typically includes an inorganic insulating material such as silicon nitride ($SiN_x$) or silicon oxide ($SiO_x$). The active layer 14 is formed from the first semiconductor layer and typically includes undoped amorphous silicon. The ohmic contact layer 48 is formed from the second semiconductor layer and typically includes an $n^+$ amorphous silicon layer. The data metal layer typically includes a material such as molybdenum (Mo), titanium (Ti), and tantalum (Ta).

After depositing the data metal layer, a photo-resist film (not shown) is formed and is photolithographically patterned using a second mask pattern. Specifically, the second mask pattern is provided as a diffractive exposure mask having a diffractive exposure region corresponding to a channel of a subsequently formed TFT. Upon exposure through the second mask pattern and development, a photo-resist pattern is created wherein a portion of the photo-resist film remaining in a region corresponding to the channel has a lower height relative to portions of the photo-resist film remaining in regions outside the channel.

Subsequently, the photo-resist pattern is used as a mask to pattern the data metal layer in a wet etching process, thereby forming the aforementioned data metal pattern, wherein the source and drain electrodes 10 and 12 are connected to each other in a region corresponding to the channel of the subsequently formed TFT 6. Next, the photo-resist pattern is used as a mask to sequentially pattern the first and second semiconductor layers in a dry etching process and form the aforementioned semiconductor pattern.

After the semiconductor pattern is formed, the portion of the photo-resist having the relatively lower height is removed from the region corresponding to the channel in an ashing process. Upon performing the ashing process, the relatively thicker portions of the photo-resist in regions outside the channel region are thinned but, nevertheless, remain. Using the remaining photo-resist pattern as a mask, the portion of the data metal layer and the ohmic contact layer 48 arranged in the channel region are then etched in a dry etching process. As a result, the active layer 14 within the channel region is exposed, the source electrode 10 is disconnected from the drain electrode 12, and the remaining photo-resist pattern is removed in a stripping process.

Referring next to FIG. 3C, the passivation film 50 is coated over the entire surface of the lower substrate 42, and on the gate insulting film 44, the data metal pattern, and the active layer 14. In a third mask process, the first to fourth contact holes 16, 24, 30, and 38, respectively, are formed.

Specifically, the passivation film 50 is formed over the surface of the lower substrate 42, and on the gate insulting film 44, the data metal pattern, and the active layer 14 via a deposition technique such as PECVD. The passivation film 50 typically includes an inorganic insulating material such as $SiN_x$ or $SiO_x$, or an organic material having a small dielectric constant such as an acrylic organic compound, benzocyclobutene (BCB) or perfluorocyclobutane (PFCB). The passivation film 50 is then patterned via an overlaying third mask pattern using photolithography and etching processes to thereby define the first to fourth contact holes 16, 24, 30 and 38.

The first contact hole 16 is formed through the passivation film 50 to expose the drain electrode 12, the second contact hole 24 is formed through the passivation film 50 to expose the upper storage electrode 22, the third contact hole 30 is formed through the passivation film 50 and the gate insulating film 44 to expose the lower gate pad electrode 28, and the fourth contact hole 38 is formed through the passivation film 50 to expose the lower data pad electrode 36.

Referring next to FIG. 3D, a transparent conductive pattern including the pixel electrode 18, the upper gate pad electrode 32, and the upper data pad electrode 40 are formed on the passivation film 50 in a fourth mask process.

Specifically, a transparent conductive material is coated over the entire surface of the passivation film 50 and within the first to fourth contact holes 16, 24, 30, and 38 via a deposition technique such as sputtering. The transparent conductive material typically includes indium-tin-oxide (ITO), tin-oxide (TO), or indium-zinc-oxide (IZO). In a fourth mask process, the transparent conductive material is patterned using photolithographic and etching techniques using a fourth mask pattern to thereby form the aforementioned transparent conductive pattern.

Accordingly, the pixel electrode 18 is electrically connected to the drain electrode 12 via the first contact hole 16 while also being electrically connected to the upper storage electrode 22, via the second contact hole 24. The upper gate pad electrode 32 is electrically connected to the lower gate pad electrode 28 via the third contact hole 30 and the upper data pad electrode 40 is electrically connected to the lower data pad electrode 48 via the fourth contact hole 38.

While the TFT array substrate described above may be formed using a four-mask process that is advantageous over previously known five-mask processes, the four-mask process can still be undesirably complicated and, therefore, costly. Accordingly, it would be beneficial to fabricate a TFT array substrate according to a less complex, and therefore less costly, process.

Further, because the active and ohmic contact layers 14 and 48, respectively, are below the upper storage electrode 22, the distance between the upper storage electrode 22 and the aforementioned previous gate line 2 (functioning as a lower storage electrode) can become undesirably large. Because capacitance is inversely proportional to the distance between capacitor electrodes, the capacitance of the related art storage capacitor 20 can become undesirably reduced. To compensate for such a reduction, the area of overlap between the upper storage electrode 22 and the previous gate line 2 must be enlarged. This solution, however, is undesirable as an increase in overlap area between the upper storage electrode 22 and the previous gate line 2 results in a decrease in the aperture ratio of the pixel electrode 18.

SUMMARY OF THE INVENTION

Accordingly, the present invention is directed to a liquid crystal display device and a method of fabricating the same that substantially obviates one or more of the problems due to limitations and disadvantages of the related art.

An advantage of the present invention provides a TFT substrate having an enlarged storage capacitance without reducing the aperture ratio of a pixel electrode and a simplified method of fabricating the same.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display device may, for example, include gate lines; data lines crossing the gate lines thereby defining pixel areas; a gate insulating film between the gate and data lines; a plurality of thin film transistors connected to the gate and data lines; a semiconductor layer defining a channel of each thin film transistor; a passivation film on the data lines and on the thin film transistors; at least one pixel hole aligned within a corresponding pixel area, wherein the at least one pixel hole is formed through the passivation film and at least partially through the gate insulating film; a pixel electrode within the at least one pixel hole, wherein a portion of the at least one pixel electrode is on the gate insulating film and overlaps a gate line to form a storage capacitor.

In another aspect of the present invention, the principles of the present invention provide a method of fabricating a liquid crystal display device that may, for example, include forming a gate metal pattern on a substrate using a first mask, wherein the gate metal pattern includes a plurality of gate lines and a plurality of gate electrodes; forming a gate insulating film on the gate metal pattern; sequentially forming a semiconductor pattern and a data metal pattern on the gate insulating film using a second mask, wherein the data metal pattern includes a plurality of data lines, a plurality of source electrodes, and a plurality of drain electrodes; forming a passivation film on the data metal pattern; forming at least one pixel hole through the passivation film and at least partially through the gate insulating film using a third mask, wherein a portion of the drain electrode is exposed by the at least one pixel hole; and forming a pixel electrode within the at least one pixel hole, wherein the pixel electrode contacts the exposed portion of the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 8A to 8E illustrate sectional views specifically explaining the second mask process shown in FIGS. 7A and 7B;

FIGS. 10A to 10E illustrate sectional views specifically explaining the third mask process shown in FIGS. 9A and 9B.

DETAILED DESCRIPTION OF THE ILLUSTRATED EMBODIMENTS

Reference will now be made in detail to embodiments of the present invention, examples of which are illustrated in the accompanying drawings.

Figure 4:
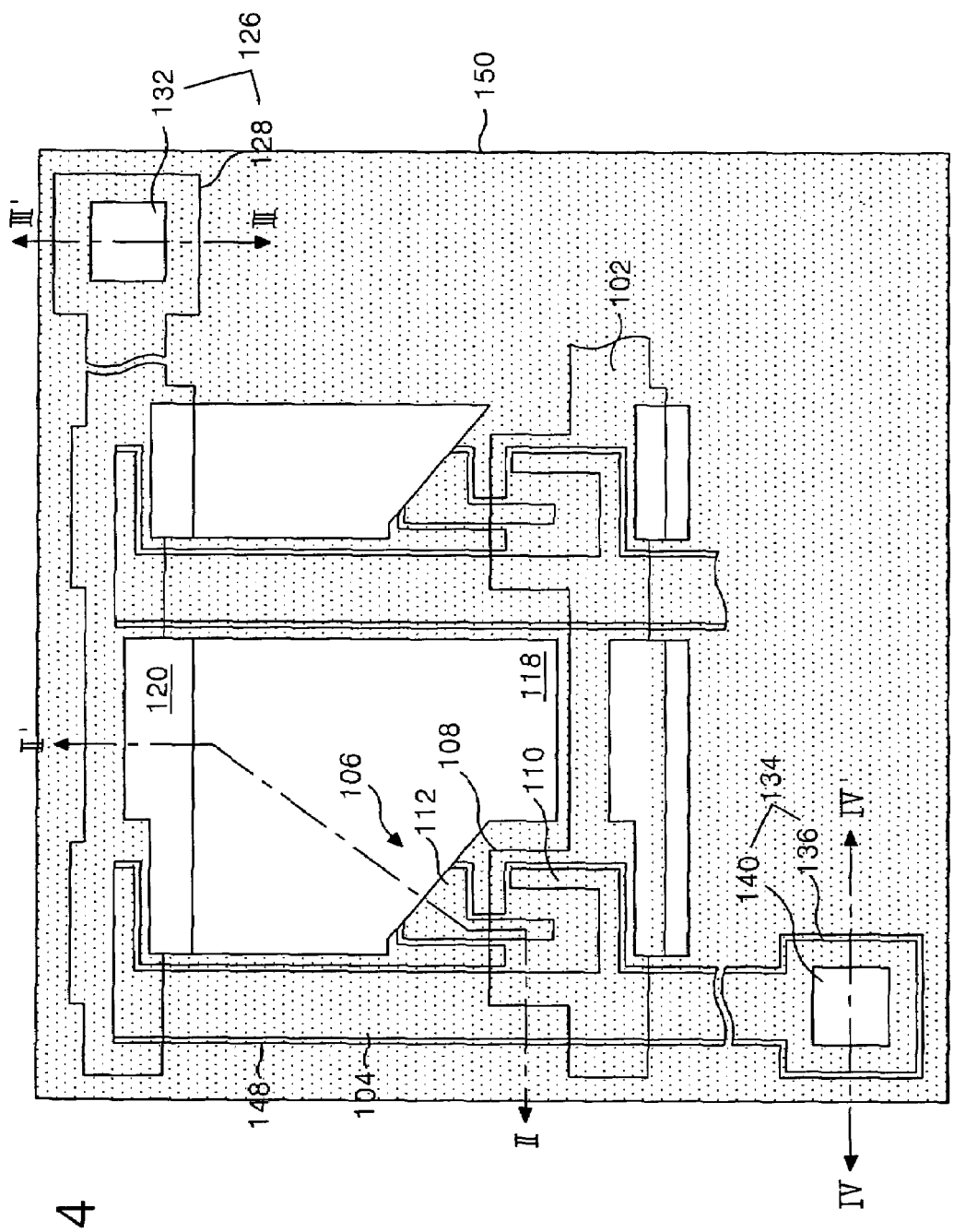
FIG. 4 illustrates a plan view of a portion of a TFT array substrate according to principles of the present invention.
Figure 5:
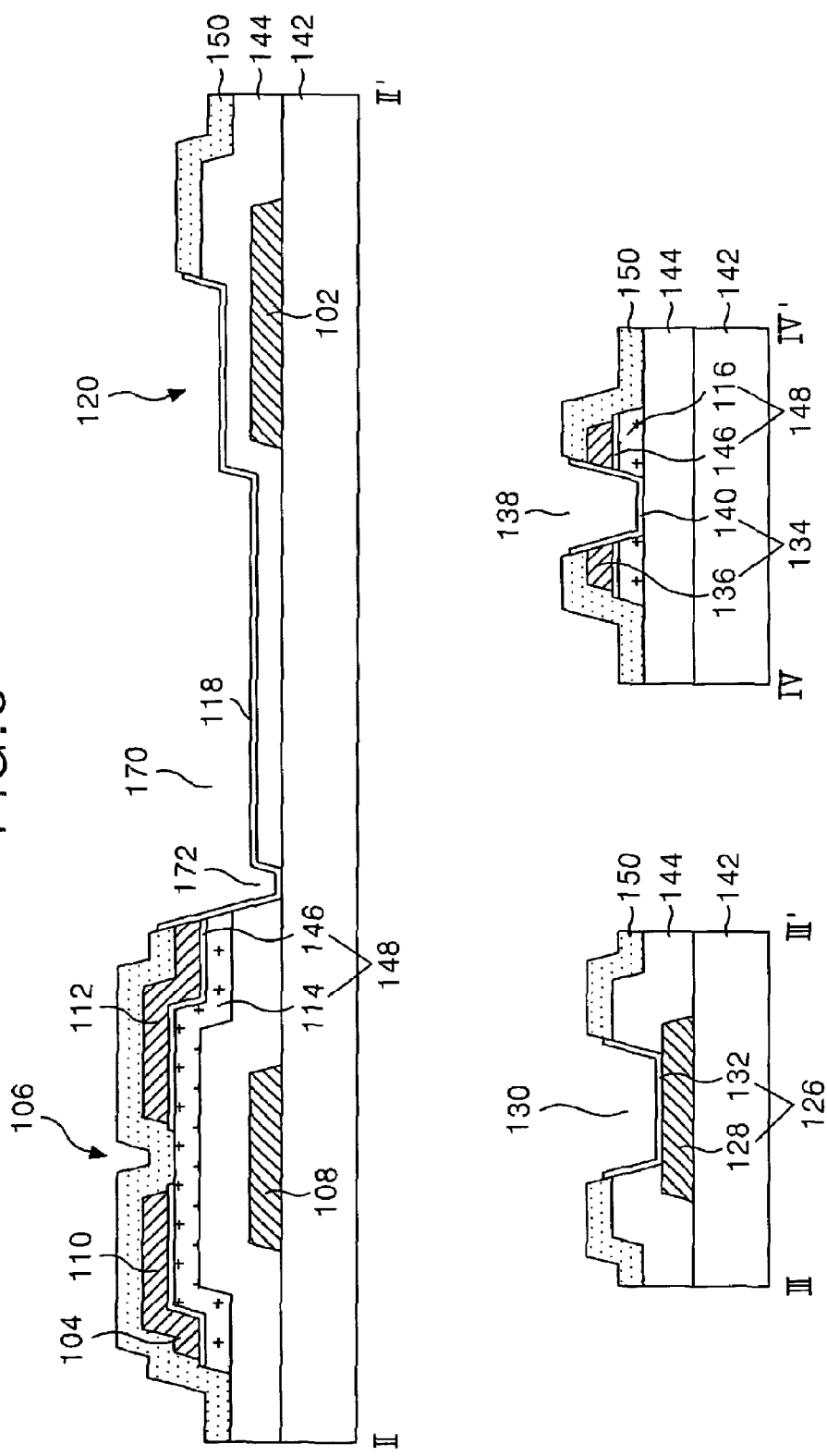
FIG. 5 illustrates a sectional view of the TFT array substrate taken along lines II-II', III-III', and IV-IV' shown in FIG. 4.

FIG. 4 illustrates a plan view of a portion of a TFT array substrate according to principles of the present invention. FIG. 5 illustrates a sectional view of the TFT array substrate taken along lines II-II', III-III, and IV-IV' shown in FIG. 4.

Referring to FIGS. 4 and 5, the TFT array substrate according to principles of the present invention, may, for example, include gate lines 102 and data lines 104 formed so as to cross each other on a lower substrate 142 to define a plurality of pixel areas; a gate insulating film 144 formed between the gate and data lines 102 and 104; a TFT 106 at each crossing of the gate and data lines 102 and 104; a pixel electrode 118 provided within each pixel area and connected to a corresponding TFT 106; storage capacitors 120; a gate pad 126 connected to each gate line 102; and a data pad 134 connected to each data line 104. In one aspect of the present invention, a storage capacitor 120 associated each particular pixel area may be provided at regions where the pixel electrode 118 of a particular pixel area and a gate line 102 adjacent to the pixel area overlap.

Each TFT 106 may allow a pixel signal transmitted by a corresponding data line 104 to be charged and maintained within a corresponding pixel electrode 118 in response to a scanning signal transmitted by a corresponding gate line 102. To this end, each TFT 106 may, for example, include a gate electrode 108 connected to a corresponding gate line 102, a source electrode 110 connected to a corresponding data line 104, a drain electrode 112 connected to a corresponding pixel electrode 118, an active layer 114 overlapping the gate electrode 108 and separated from the gate electrode 108 by the gate insulating film 144 and defining a channel between the source electrode 110 and the drain electrode 112, and an ohmic contact layer 146 formed on the active layer 116 and outside the channel for ohmically contacting the source and drain electrodes 110 and 112.

In one aspect of the present invention, the aforementioned active and ohmic contact layers 114 and 146, as they are associated with each TFT 106, may be part of a semiconductor pattern 148. According to principles of the present invention, the semiconductor pattern 148 may further include portions the active and ohmic contact layers 116 and 146 that are overlapped by the data lines 104 outside the TFTs 106.

As discussed above, each pixel area is defined by the crossings of gate and data lines 102 and 104. According to the principles of the present invention, a pixel hole 170 may be formed through portion of a passivation film 150 that is aligned within the pixel areas. In one aspect of the present invention, each pixel hole 170 may expose at least a portion of a corresponding drain electrode 112. In another aspect of the present invention, each pixel hole 170 may expose a portion of the gate insulating film 144 also aligned within the pixel areas. In still another aspect of the present invention, each pixel hole 170 may be formed at least partially through the gate insulating film 144. In one aspect of the present invention, a first contact hole 172 may be formed within a portion of the gate insulating film 144 that is exposed within each pixel hole 170. In another aspect of the present invention, each first contact hole 172 may be formed through the gate insulating film 144. In still another aspect of the present invention, each first contact hole 172 may expose the substrate 142. In one aspect of the present invention, each pixel electrode 118 may be formed within the pixel hole 170 and directly contact the gate insulating film 144. In another aspect of the present invention, each pixel electrode 118 may contact at least one sidewall of the passivation film 150 that defines the pixel hole 170. In still another aspect of the present invention, each pixel electrode 118 may contact a portion of a corresponding drain electrode 122 that is exposed within the pixel hole 170. In yet another aspect of the present invention, each pixel electrode 118 may be formed within the first contact hole 172.

During operation, a potential difference may be generated between the pixel electrode 118 and a common electrode (not shown). In the presence of an electric field generated by the potential difference, molecules within the liquid crystal material (which have a particular dielectric anisotropy), may rotate to align themselves between the pixel and common electrodes. The magnitude of the applied electric field determines the extent of rotation of the liquid crystal molecules. Accordingly, various gray scale levels of light emitted by a light source (not shown) may be transmitted by a pixel area by varying the magnitude of the applied electric field.

Figure 1:
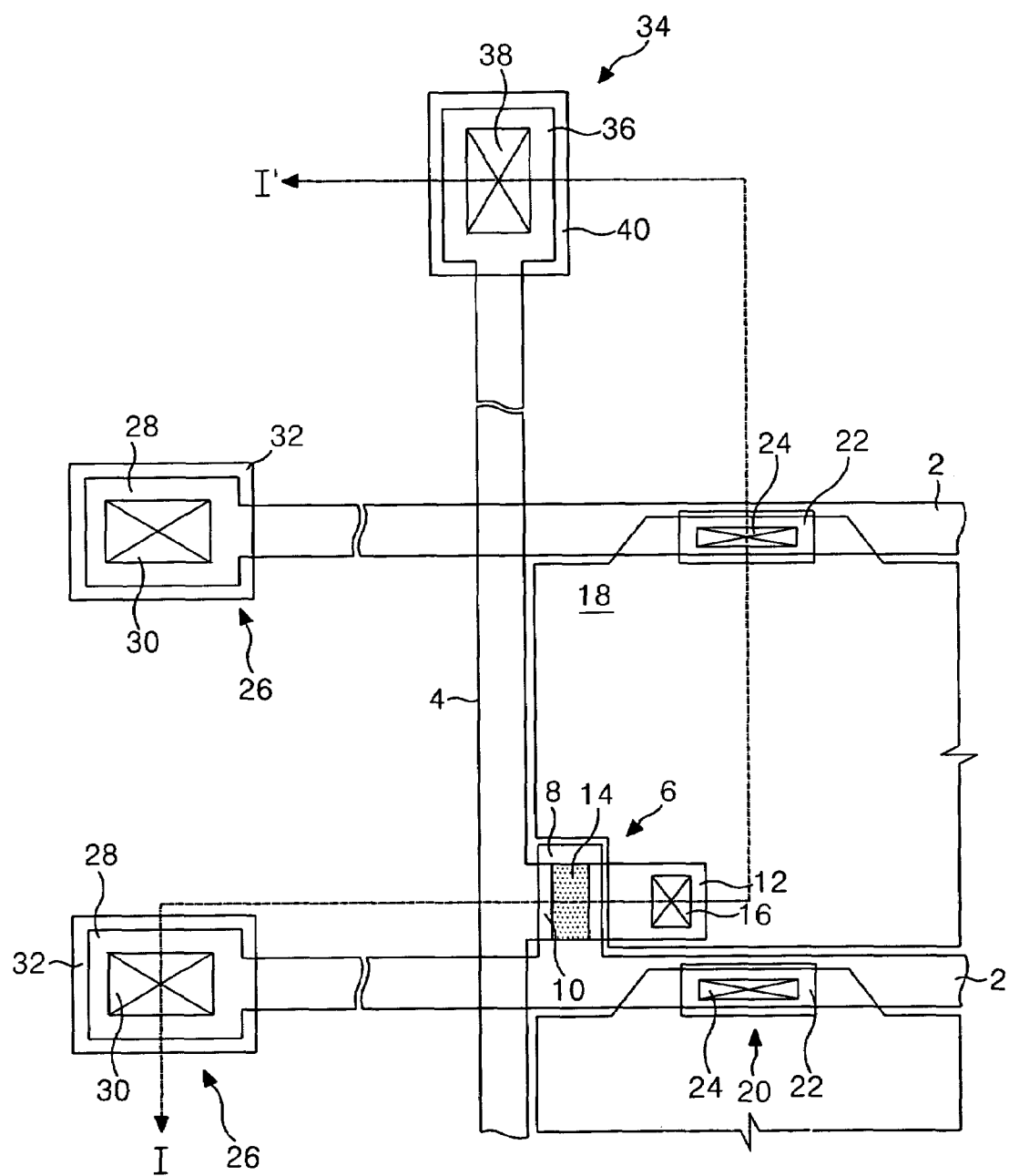
FIG. 1 illustrates a plan view of a thin film transistor (TFT) array substrate, fabricated using a related art four-mask process.
Figure 2:
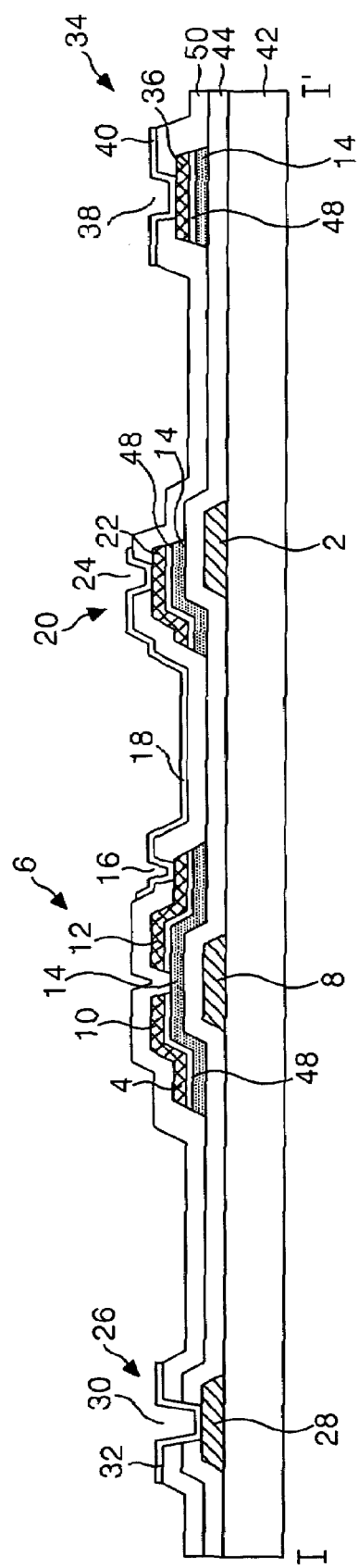
FIG. 2 illustrates a sectional view of the TFT array substrate taken along line I-I' shown in FIG. 1.
Figure 3A:
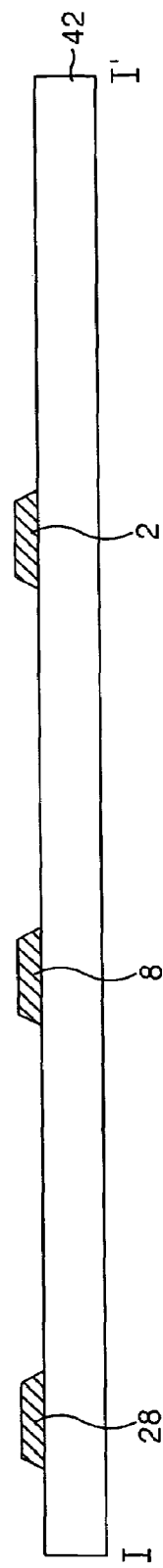
FIGS. 3A to 3D illustrate a method of fabricating the TFT array substrate shown in FIG. 2.
Figure 3B:
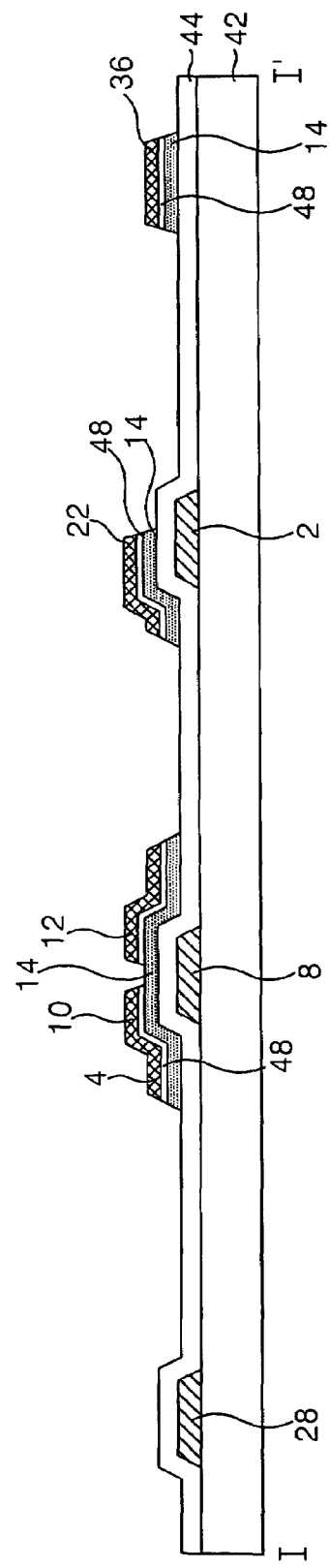
Figure 3C:
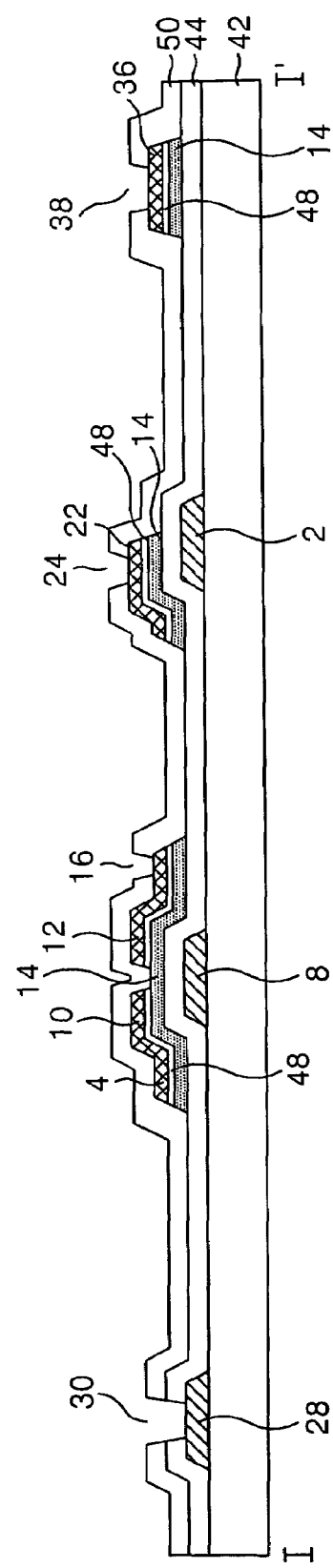
Figure 3D:
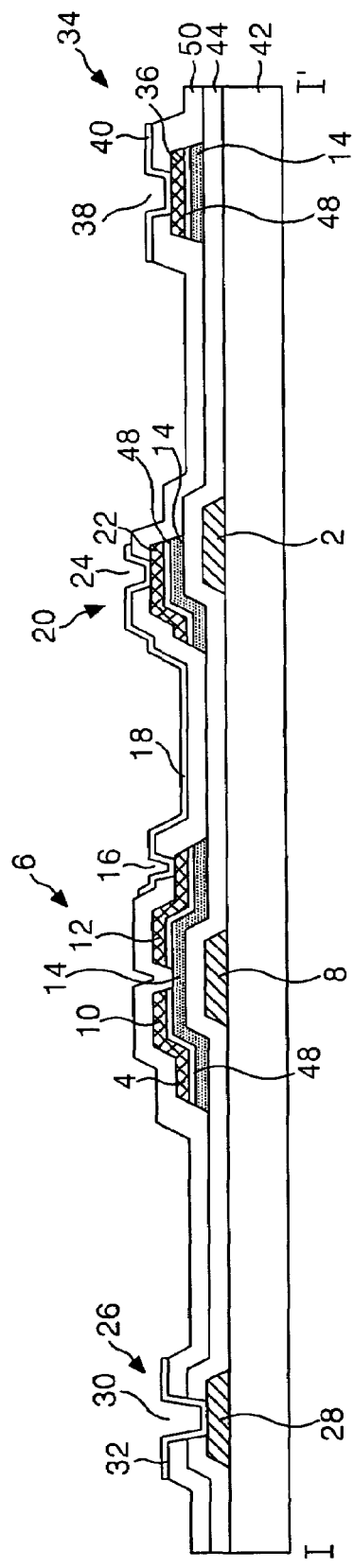

According to principles of the present invention, each storage capacitor 120 may, for example, comprise a portion of a pixel electrode 118 that overlaps a corresponding gate line 102 as well as a portion of the gate insulating film 144 arranged between the overlapping pixel electrode 118 and gate line 102. In one aspect of the present invention, the thickness of the portion of the gate insulating film 144 arranged between the pixel electrode 118 and the gate line 102 may be reduced compared to the combined thickness of the active and ohmic contact layers 14 and 48 and gate insulating film 44 between the upper storage electrode 22 and the gate line 2 shown in FIG. 2. Accordingly, the storage capacitor 120 shown in FIG. 5 may have a larger capacitance than the related art storage capacitor 20 shown in FIG. 2 while minimizing the area of overlap between the pixel electrode 118 and the gate line 102 and, therefore, maximizing the aperture ratio of the corresponding pixel area.

According to principles of the present invention, each gate line 102 may be connected to a gate driver (not shown) via a corresponding the gate pad 126. Accordingly, each gate pad 126 may, for example, include a lower gate pad electrode 128 and an upper gate pad electrode 132. In one aspect of the present invention, the lower gate pad electrode 128 may extend from the gate line 102. In another aspect of the present invention, the upper gate pad electrode 132 may be connected to the lower gate pad electrode 128 via a second contact hole 130 formed through the passivation film 150 and the gate insulating film 144. In still another aspect of the present invention, the upper gate pad electrode 132 may contact at least one sidewall of the passivation film 150 that defines the second contact hole 130.

According to principles of the present invention, each data line 104 may be connected to a data driver (not shown) via a data pad 134. Accordingly, each data pad 134 may, for example, include a lower data pad electrode 136 and an upper data pad electrode 140. In one aspect of the present invention, the lower data pad electrode 136 may extend from the data line 104. In another aspect of the present invention, the upper data pad electrode 140 may be connected to the lower data pad electrode 136 via a third contact hole 138 formed through the passivation film 150. In still another aspect of the present invention, the third contact hole 138 may be formed at least partially through the lower data pad electrode 136. Accordingly, the upper data pad electrode 140 may, for example, contact at least a sidewall portion of the lower data pad electrode 136 exposed by the third contact hole 138.

As described above, the aforementioned active and ohmic contact layers 114 and 146, as they are associated with each TFT 106 and data line 104, were considered as part of the semiconductor pattern 148. According to principles of the present invention, the semiconductor pattern 148 may further include portions of the active and ohmic contact layers 114 and 146 that are overlapped by the lower data pad electrodes 136. Thus, and in another aspect of the present invention, the third contact hole 138 may further be formed at least partially through portions of the semiconductor pattern 148 that are overlapped by the lower data pad electrodes 136. Accordingly, the upper data pad electrode 140 may, for example, contact at least a sidewall portion of the semiconductor pattern 148 that is overlapped by the lower data pad electrode 136 and exposed by the third contact hole 138.

Having described the TFT array substrate exemplarily illustrated in FIGS. 4 and 5, a method of fabricating the TFT array substrate according to principles of the present invention (i.e., via a three-mask process) will now be described in greater detail with reference to FIGS. 6A to 10E.

Figure 6A:
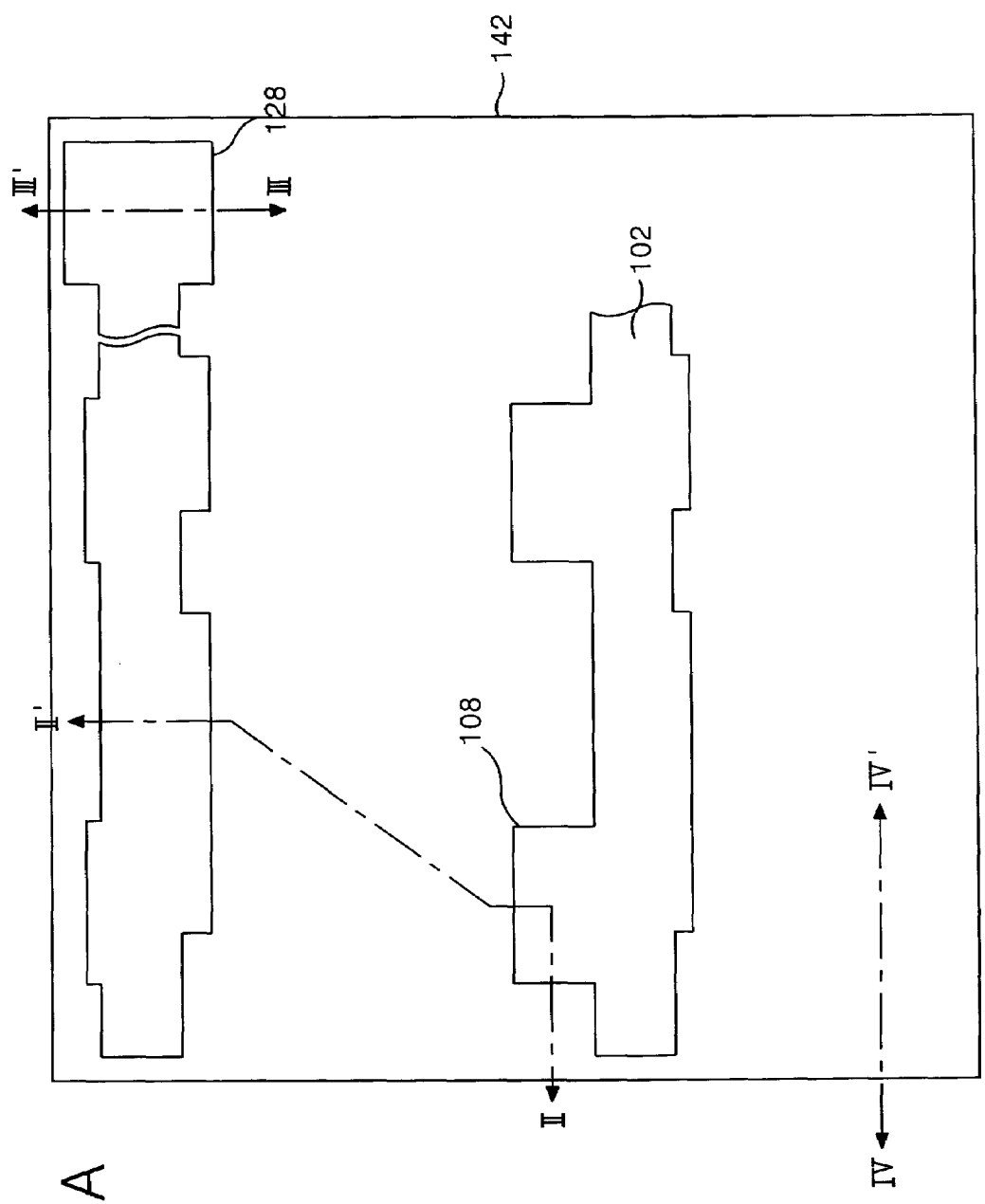
FIGS. 6A and 6B illustrate plan and sectional views, respectively, describing a first mask process in the method of fabricating the TFT array substrate according to principles of the present invention.
Figure 6B:
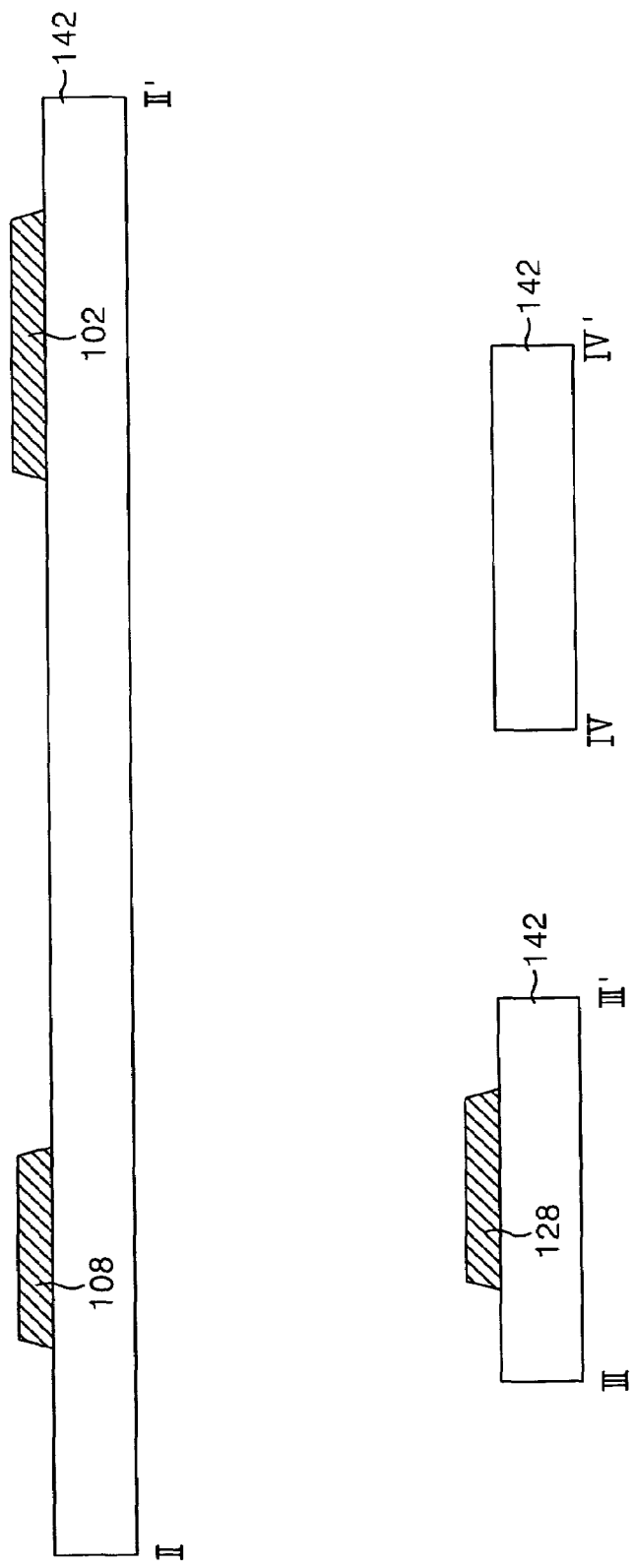

FIGS. 6A and 6B illustrate plan and sectional views, respectively, describing a first mask process in the method of fabricating the TFT array substrate according to principles of the present invention.

Referring to FIGS. 6A and 6B, a gate metal pattern may be formed on the lower substrate 142 in a first mask process. In one aspect of the present invention, the gate metal pattern may include, for example, the gate line 102, the gate electrode 108 connected to the gate line 102, and the lower gate pad electrode 128.

According to principles of the present invention, the gate metal pattern may be formed by depositing a gate metal layer over the lower substrate 142 via a deposition technique such as sputtering. After being deposited, the gate metal layer may be patterned via photolithographic and etching techniques using a first mask to provide the aforementioned gate metal pattern. In one aspect of the present invention, the gate metal layer may include a material such as Cr, MoW, Cr/Al, Cu, Al(Nd), Mo/Al, Mo/Al(Nd) or Cr/Al(Nd), or the like, or combinations thereof FIGS. 7A and 7B illustrate plan and sectional views, respectively, generally describing a second mask process in the method of fabricating the TFT substrate according to principles of the present invention.

Figure 7A:
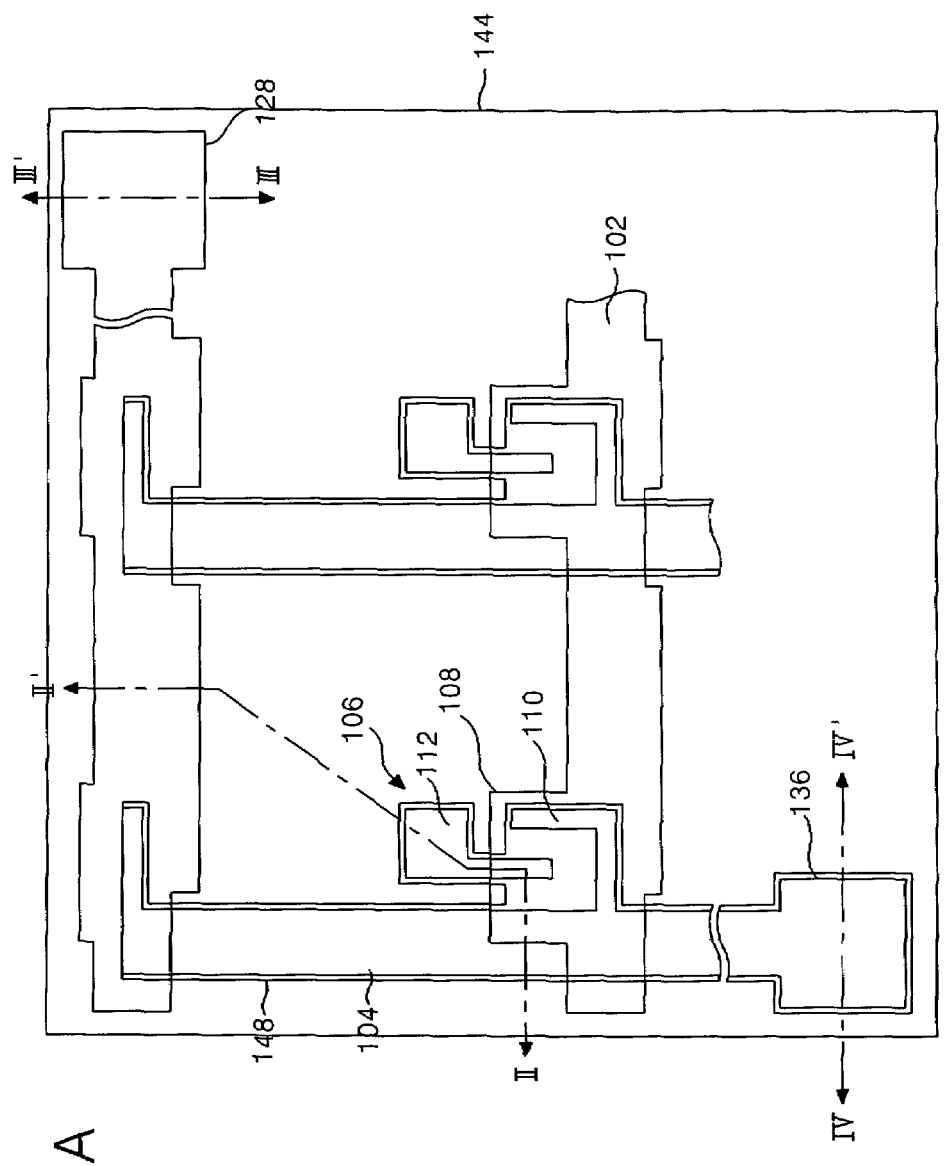
FIGS. 7A and 7B illustrate plan and sectional views, respectively, describing a second mask process in the method of fabricating the TFT array substrate according to principles of the present invention.
Figure 7B:
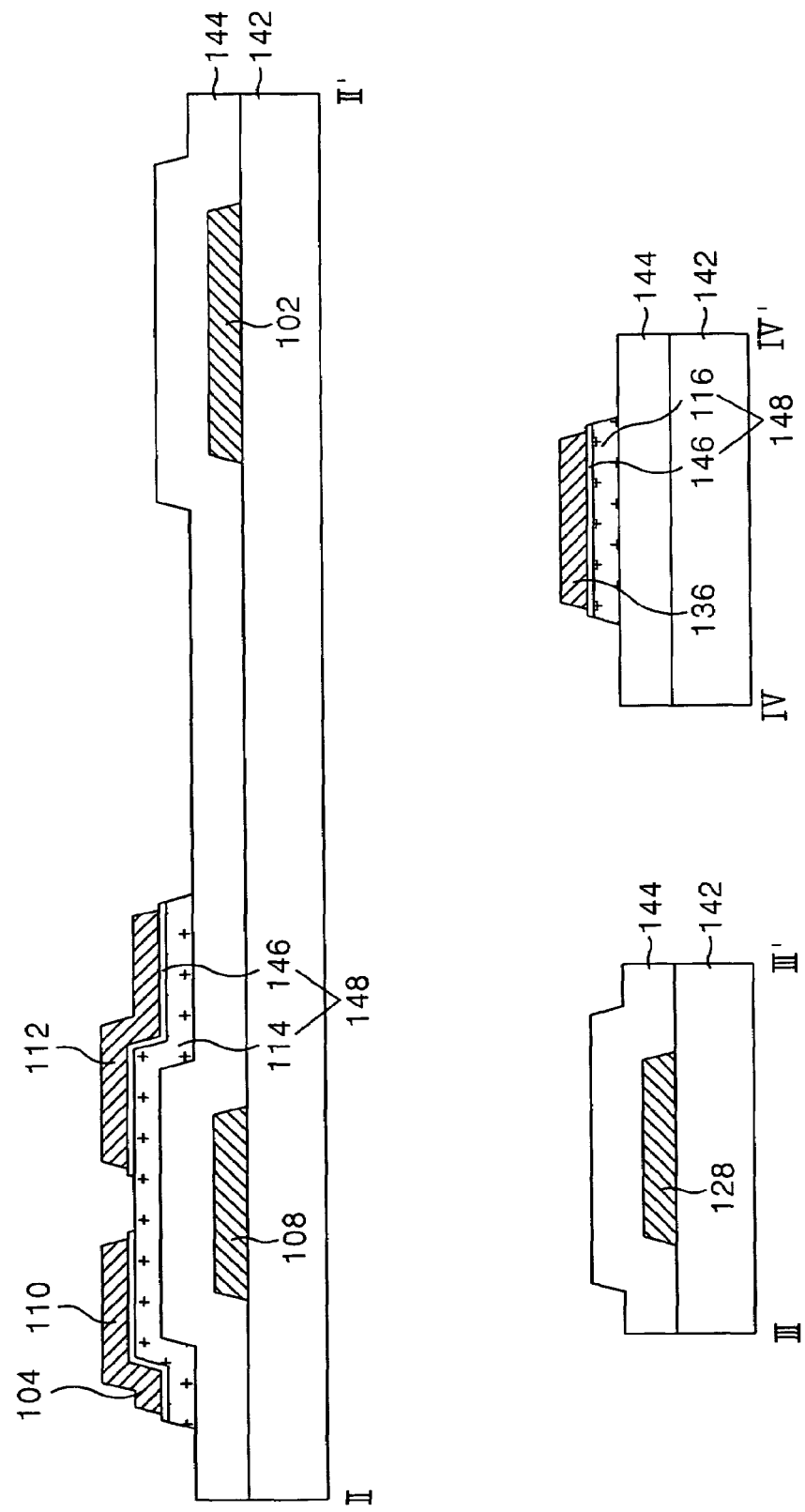

Referring to FIGS. 7A and 7B, a gate insulating film 144, the aforementioned semiconductor pattern 148, and a data metal pattern may be formed on the gate metal pattern in a second mask process. In one aspect of the present invention, the data metal pattern may, for example, include the data lines 104, the source electrodes 110, the drain electrodes 112, and the lower data pad electrodes 136.

FIGS. 8A to 8E illustrate sectional views specifically explaining the second mask process shown in FIGS. 7A and 7B.

Referring to FIG. 8A, the gate insulating film 144 may be formed over the lower substrate 142 and on the gate metal pattern. In one aspect of the present invention, the gate insulating film 144 may be formed via a deposition technique such as PEVCD, sputtering, or the like. In another aspect of the present invention, the gate insulating film 144 may, for example, include an inorganic insulating material such as $SiN_x$, $SiO_x$, or the like, or combinations thereof.

Next, a first semiconductor layer 115, a second semiconductor layer 145, and a data metal layer 105 may be sequentially formed on the gate insulating film 144. In one aspect of the present invention, the first and second semiconductor layers 115 and 145 may be formed via a deposition technique such as PEVCD, or the like. In another aspect of the present invention, the first semiconductor layer 115 may, for example, include undoped amorphous silicon. In still another aspect of the present invention, the second semiconductor layer 145 may, for example, include n+ or p+ amorphous silicon. In one aspect of the present invention, the data metal layer 105 may be formed via a deposition technique such as sputtering, or the like. In another aspect of the present invention, the data metal layer 105 may, for example, be formed of a material that has a suitable etch selectivity with respect to the patterned passivation film 150 in a dry etch process (e.g., a metal such as Mo, Cu, Al, Ti, Cr, MoW, AlNd, Ta, or the like, or combinations thereof).

A first photo-resist film 219 may then be formed over the entire surface of the data metal layer 105 and subsequently be exposed to light and developed by photolithographic techniques using a second mask pattern 210. According to principles of the present invention, the second mask pattern 210 may, for example, be provided as a diffractive exposure mask. For example, the second mask pattern may include a mask substrate 212 formed of a material that is suitably transparent to, for example ultraviolet (UV) light (e.g., quartz), a shielding layer 214 formed of a material that is suitably opaque to UV light (e.g., Cr, $CrO_x$, etc.), and a plurality of slits 216 formed within the predetermined portions of the shielding layer 214. Accordingly, such a diffractive exposure mask 210 includes a full exposure area aligned with portions of the mask 210 consisting only of the mask substrate 212, a diffractive exposure area aligned with portions of the mask 210 consisting of the shielding layer 214 having the slits 216 formed therein and the mask substrate 212, and a shielding area aligned with portions of the mask 210 consisting of the mask substrate 212 and the shielding layer 214 without the slits 216.

Using the second mask pattern 210 the first photo-resist film 219 may be selectively exposed to, for example, UV light through the full and diffractive exposure areas and be developed, thereby creating a first photo-resist pattern 220 comprising first and second portions 220A and 220B aligned with the shielding and diffractive exposure areas 214 and 216, respectively, as shown in FIG. 8B. As shown, the first photo-resist pattern 220 may, for example, include a step difference between the shielding and diffractive exposure areas, wherein the step difference is aligned, for example, with a channel of a subsequently formed TFT that includes the previously formed gate electrode 108. Accordingly, the thickness of the first portions 220A not aligned with the channel may be larger than the thickness of the second portions 220B aligned with the channel.

Referring next to FIG. 8C, the first photo-resist pattern 220 may be used as a mask to pattern the data metal layer 105 and the first and second semiconductor layers 115 and 145 according to a suitable etching technique, thereby forming the aforementioned data metal and semiconductor patterns, wherein the source and drain electrodes 110 and 112 may be connected to each other over the channel.

After the data metal and semiconductor patterns are formed, the second portion 220B of the first photo-resist pattern 220 may be removed in an ashing process using oxygen ($O_2$) plasma. Upon performing the ashing process, the first portions 220A of the first photo-resist pattern 220 are thinned but, nevertheless, remain.

Figure 8D:
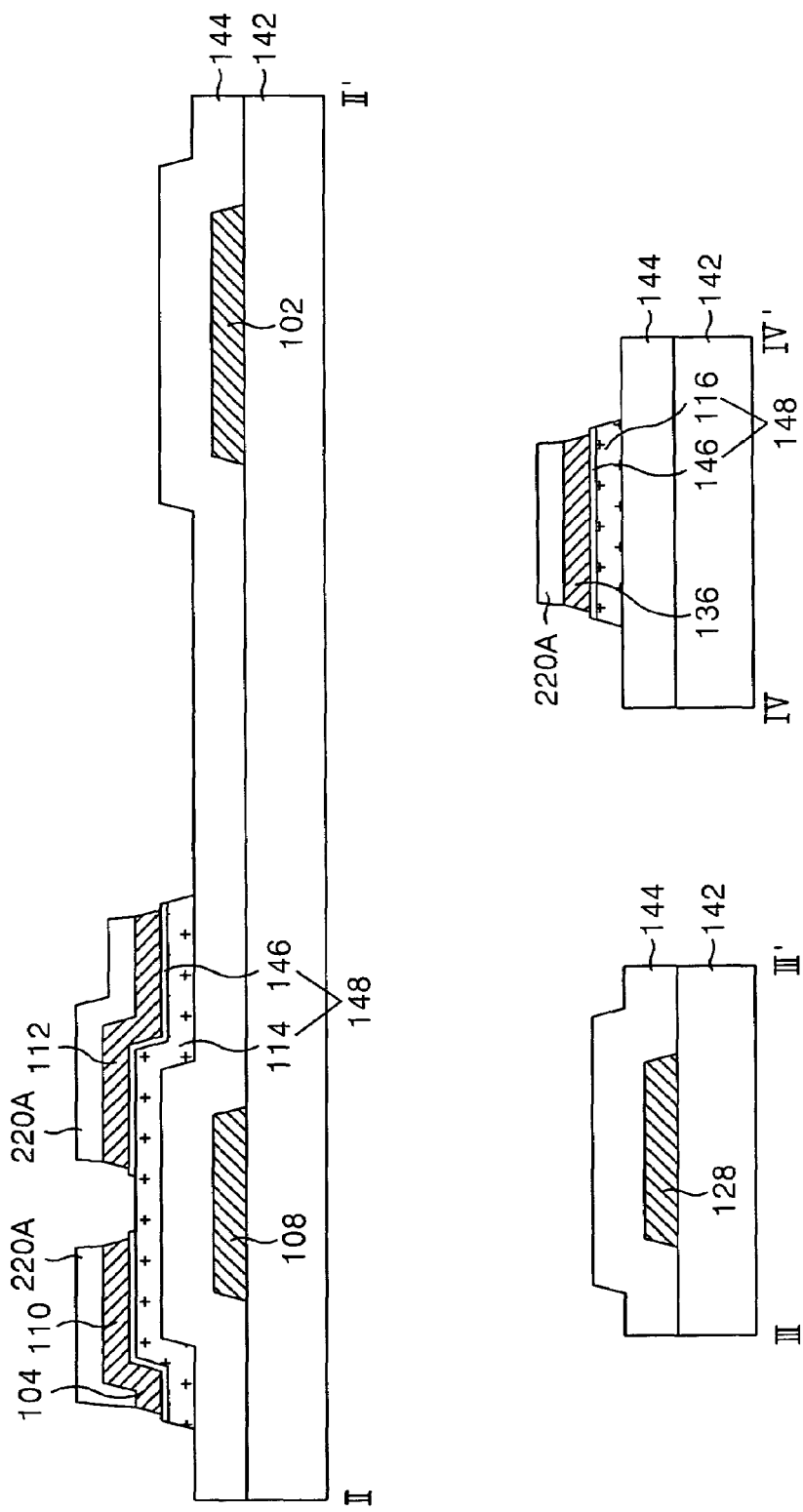

Referring to FIG. 8D, portions of the data metal pattern and the ohmic contact layer 146 in the channel region may be removed in an etching process using the remaining first portions 220A of the first photo-resist pattern 220 as a mask. As a result, the active layer 114 may be exposed within the channel and the source electrode 110 may be disconnected from the drain electrode 112.

After disconnecting the source and drain electrodes 110 and 112, the data metal pattern may be etched again using the remaining first portions 220A of the first photo-resist pattern 220 as a mask, thereby creating a step difference between the profiles of the data metal and semiconductor patterns. Subsequently, and with reference to FIG. 8E, the remaining portions of the first photo-resist pattern 220 may be removed in a stripping process.

Figure 9A:
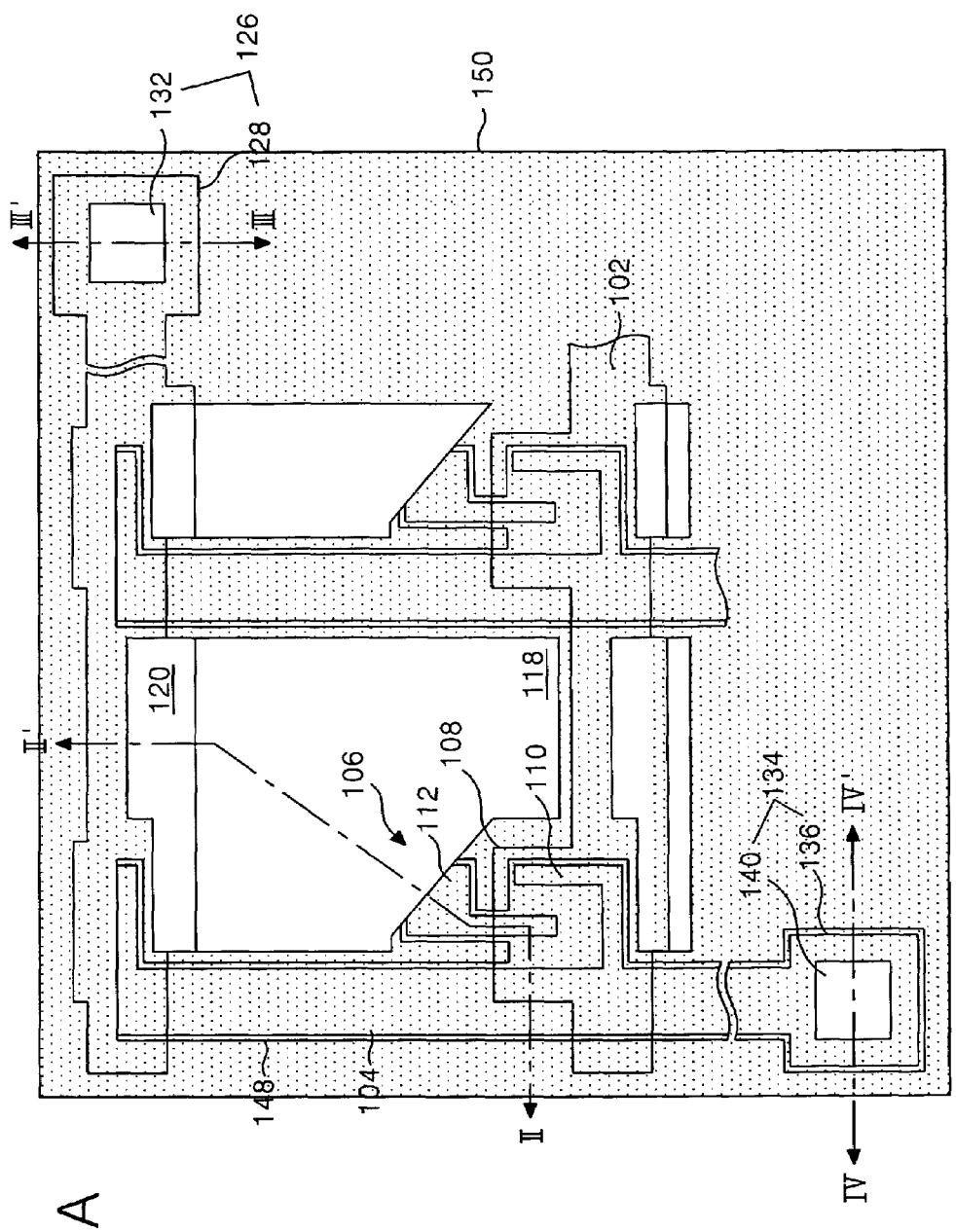
FIGS. 9A and 9B illustrate plan and sectional views, respectively, describing a third mask process in the method of fabricating the TFT array substrate according to principles of the present invention.
Figure 9B:
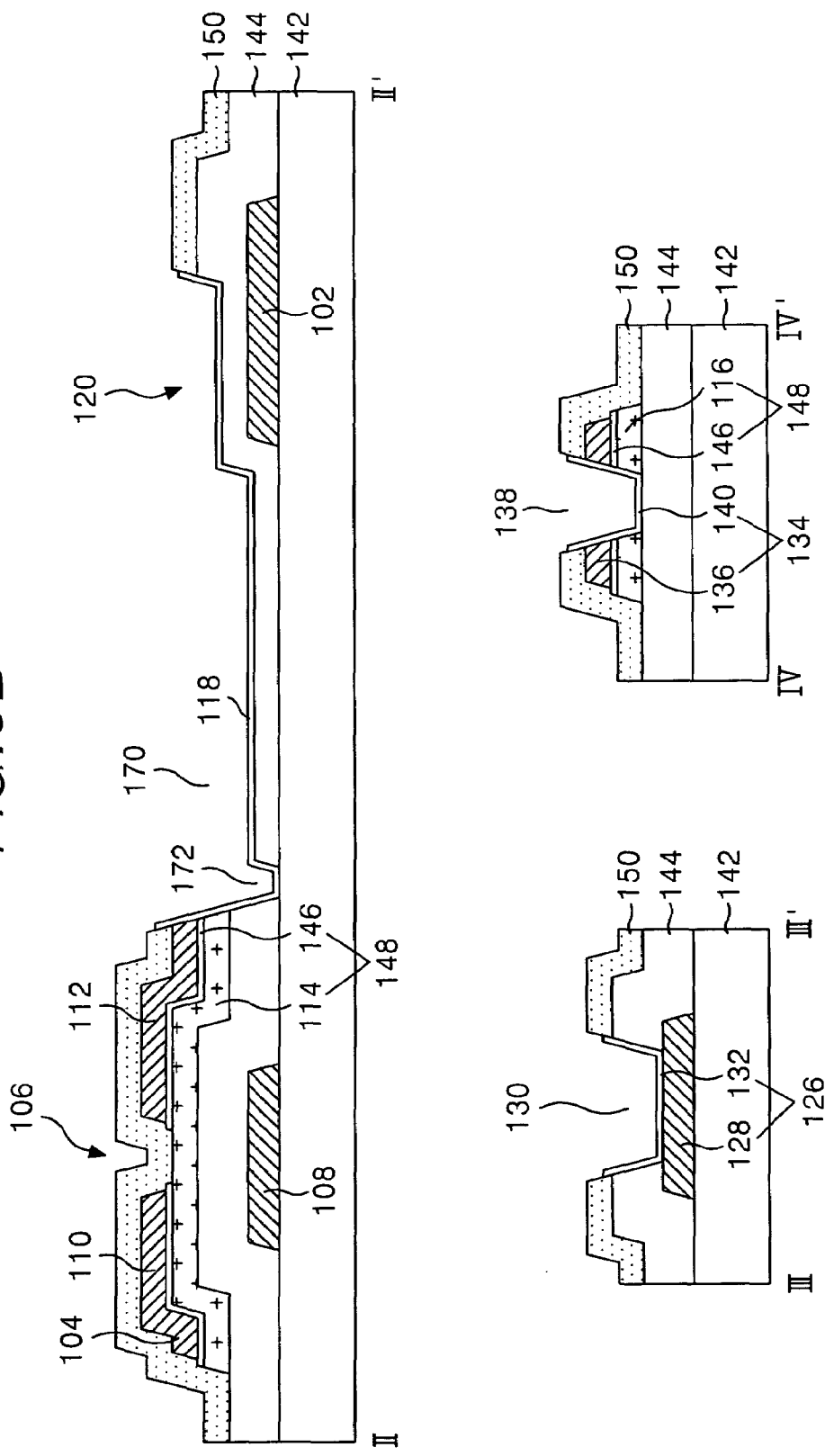

FIGS. 9A and 9B illustrate plan and sectional views, respectively, describing a third mask process in the method of fabricating the TFT array substrate according to principles of the present invention.

Referring to FIGS. 9A and 9B, the passivation film 150 having the pixel hole 170, the first to third contact holes 172, 130, and 138, respectively, and a transparent conductive pattern may be formed in a third mask process. In one aspect of the present invention, the transparent conductive pattern may, for example, include the pixel, upper gate pad, and upper data pad electrodes 118, 132, and 140, respectively.

FIGS. 10A to 10E illustrate sectional views specifically explaining the third mask process shown in FIGS. 9A and 9B.

Figure 10A:
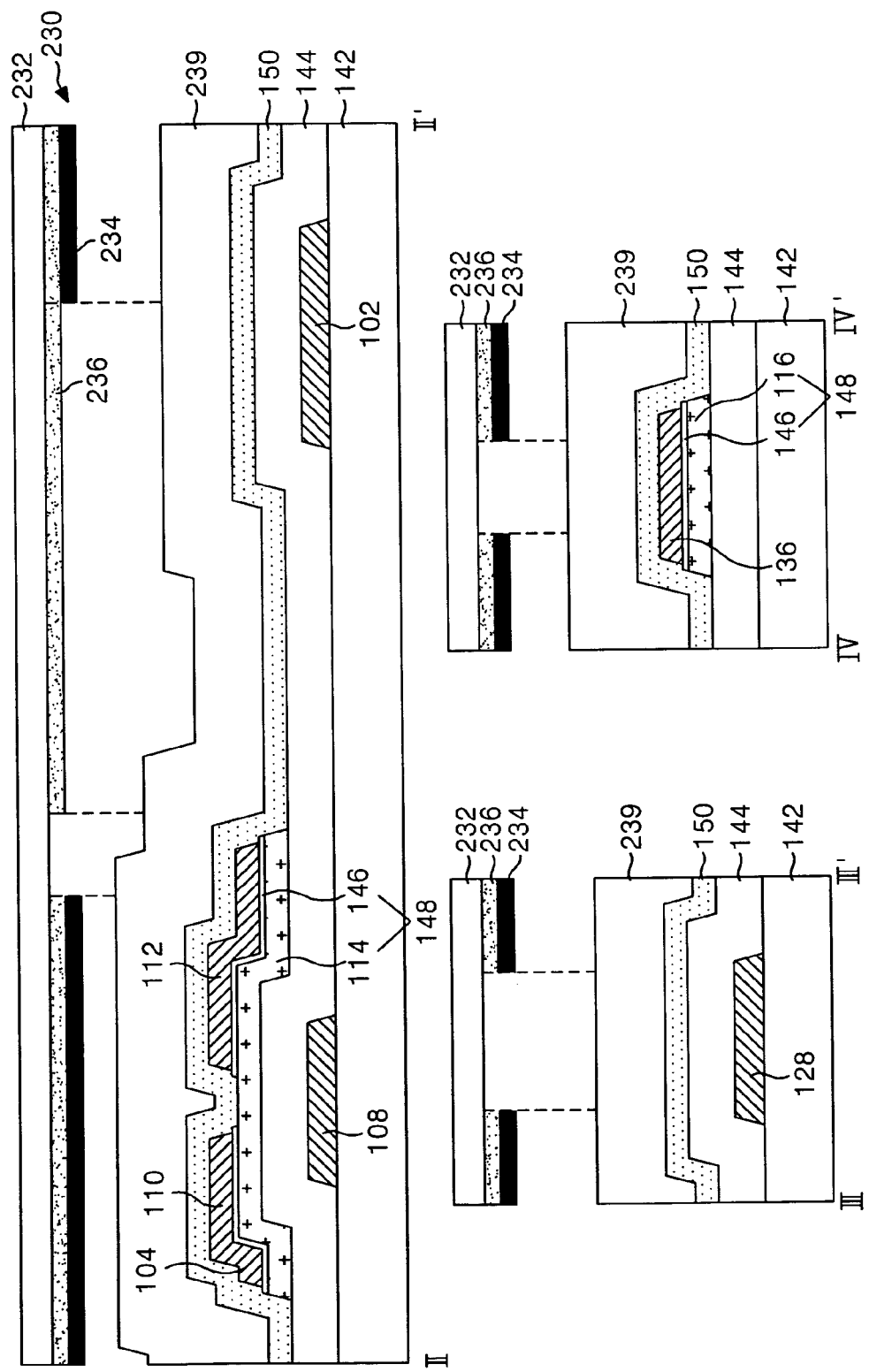

Referring to FIG. 10A, a passivation film 150 may be formed over the entire surface of the gate insulating film 144 and on the data metal pattern via a deposition technique such as PECVD, spin coating, or the like. In one aspect of the present invention, the passivation film 150 may for example, include an inorganic insulating material such as $SiN_x$, $SiO_x$, or the like, or combinations thereof, and/or an organic insulating material such as acrylic organic compound having a small dielectric constant, BCB, or PFCB, or the like, or combinations thereof.

A second photo-resist film 239 may then be formed over the entire surface of the passivation film 150 and may be photolithographically patterned using a third mask pattern. In one aspect of the present invention, the third mask pattern may be provided as a diffractive exposure mask similar to the second mask pattern discussed above with respect to FIG. 8A. In another aspect of the present invention, however, the third mask pattern may be provided as a half-tone mask 230 and, for example, include a mask substrate 232 formed of a material that is suitably transparent to UV light (e.g., quartz), a partial transmission layer 236 formed of a material that is suitably translucent to UV light (e.g., $MoSi_x$), and a shielding layer 234 formed of a material that is suitably opaque to UV light (e.g., Cr, $CrO_x$, etc.). Accordingly, such a half-tone mask 230 includes a plurality of full exposure areas aligned with portions of the mask 230 consisting only of the mask substrate 232, a partial exposure area aligned with portions of the mask 230 consisting of both the mask substrate 232 and the partial transmission layer 236, and a plurality of shielding areas aligned with portions of the mask 230 consisting of the mask substrate 232, the partial transmission layer 236, and the shielding layer 234.

Using the third mask pattern, the second photo-resist film 239 may be selectively exposed to UV light through the full and partial exposure areas and be developed, thereby creating a second photo-resist pattern 240 comprising third and fourth portions 240A and 240B aligned with the full and partial exposure areas, respectively, as shown in FIG. 10B. As shown, thickness of the third portions 240A, aligned with the shielding areas of the half-tone mask 230, may be greater than the thickness of the fourth portions 240B aligned with the partial exposure areas of the half-tone mask 230. Moreover, the second photo-resist film 239 may be completely removed in areas aligned with the full exposure areas of the half-tone mask 230.

The passivation film 150 and the gate insulating film 144 may be patterned via an etching process using the second photo-resist pattern 240 as a mask. Thus, using the second photo-resist pattern 240 having the third and fourth portions 240A and 240B as a mask, the first and second contact holes 172 and 130 may be formed through the passivation and gate insulating films 150 and 144, respectively, and the third contact hole 138 may be formed through the passivation film 150. In one aspect of the present invention, the third contact hole may be formed at least partially through the lower data pad electrode 136. In another aspect of the present invention, the third contact hole may be formed at least partially through the semiconductor pattern 148. Accordingly, the first contact hole 172 may expose at least a side surface of the drain electrode 112, the second contact hole 130 may expose the surface of the lower gate pad electrode 128, and the third contact hole 138 may expose at least a side surface of the lower data pad electrode 136, at least a side surface of the ohmic contact layer 146, and at least a side surface of the active layer 114.

After forming the pixel and first to third contact holes, and with reference to FIG. 10C, the fourth portions 240B of the second photo-resist pattern 240 may be removed in an ashing process using oxygen ($O_2$) plasma. Upon performing the ashing process, the third portions 240A of the second photo-resist pattern 240 are thinned but, nevertheless, remain. Further, portions of the passivation film 150 and the gate insulating film 144 are removed in a dry etching process using the remaining third portions 240A of the ashed second photo-resist pattern 240 as a mask to form the pixel hole 170. In one aspect of the present invention, the aforementioned ashing and dry etching processes may be successively performed within the same process chamber. Due to the topography of the second photo-resist pattern 240, edge regions of the third portions 240A that remain after the ashing process may become more protruded than edge regions of the passivation film 150.

Referring to FIG. 10D, a transparent conductive material 117 may be formed over the remaining third portions 240A of the second photo-resist pattern 240 and on the topography formed below. As shown, the transparent conductive material 117 may be formed such that substantially no material is formed on the lower portions of the protruded edge regions of the second photo-resist pattern 240, thereby improving the efficiency of a subsequent lift-off process. In one aspect of the present invention, the transparent conductive material 117 may be formed via a deposition technique such as the sputtering, or the like. In another aspect of the present invention, the transparent conductive material 117 may, for example, include a material such as ITO, TO, IZO, indium oxide (IO), or the like, or combinations thereof.

Figure 10E:
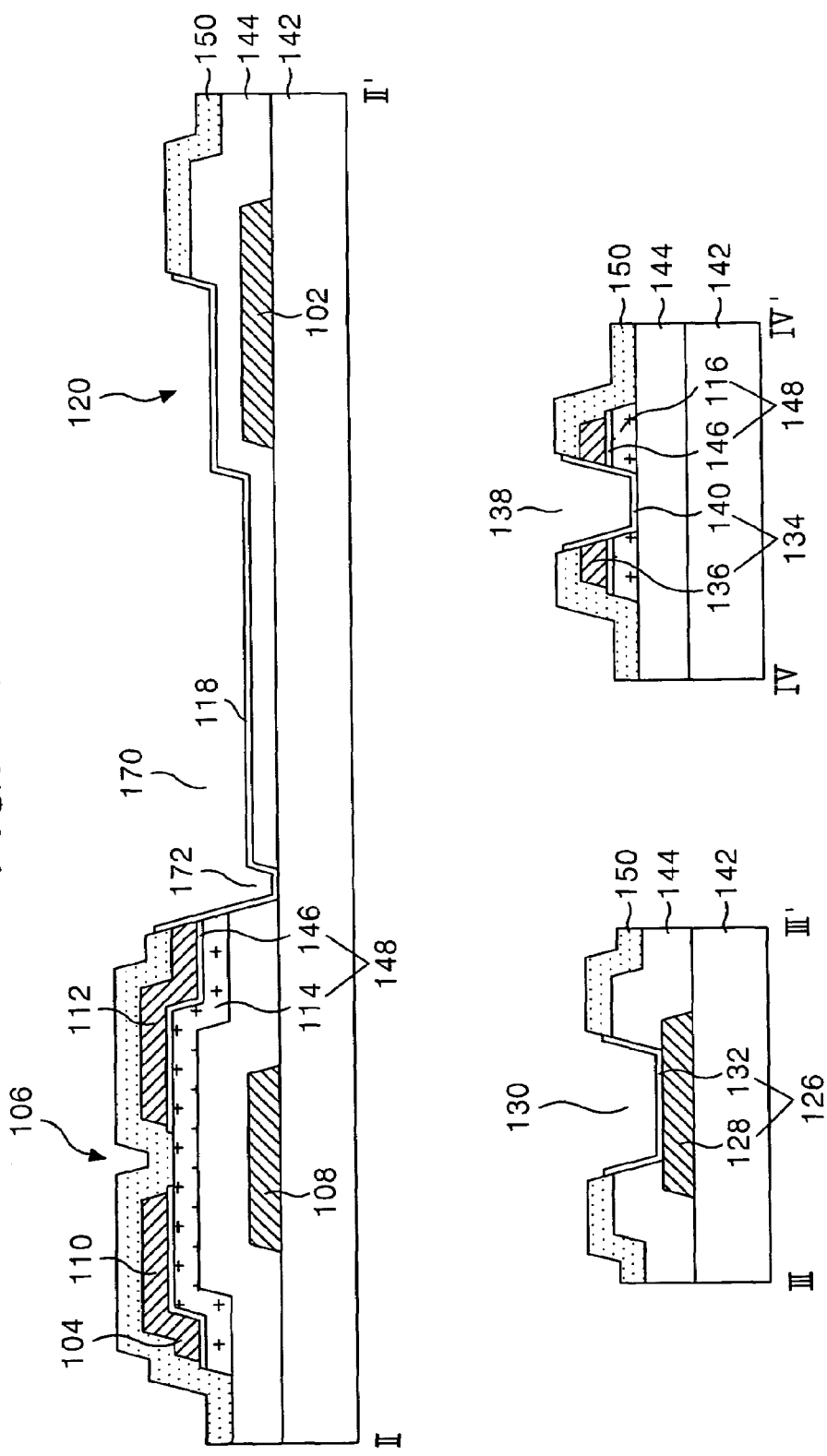

Referring to FIG. 10E, the second photo-resist pattern 240 and portions of the transparent conductive material 117 formed thereon may be simultaneously removed in a lift-off process, thereby forming a transparent conductive pattern including pixel electrode 118, the upper gate pad electrode 132, and the upper data pad electrode 140. Accordingly, the pixel electrode 118 contacts at least one sidewall of the passivation film 150 that defines the pixel hole 170 in addition to contacting the gate insulating film 144 and a portion of the drain electrode 112. The upper gate pad electrode 132 contacts at least one sidewall of the passivation film 150 that defines the first contact hole 130 in addition to contacting the lower gate pad electrode 128. The upper data pad electrode 140 contacts at least one sidewall of the passivation film 150 that defines the second contact hole 138 in addition to at least contacting the lower data pad electrode 136. Moreover, the pixel electrode 118 may overlap the gate line 102 and be separated from the gate line 102 by a gate insulating film 144 having a reduced thickness. Accordingly, the capacitance of the storage capacitor 120 fabricated according to the principles of the present invention, exemplarily described with respect to FIGS. 4 to 10E, and comprised of the gate line 102, the gate insulating film 144, and the pixel electrode 118, may be larger than the capacitance of the storage capacitor 20 fabricated according to the related art as discussed above with respect to FIGS. 1 to 3D.

As described above, a TFT array substrate may include a pixel hole 170 and first to third contact holes 172, 130, and 138, respectively, simultaneously formed using a half-tone or diffractive exposure mask to form a photo-resist pattern. Moreover, the principles of the present invention incorporate a lift-off process to simplify a process of fabricating a transparent conductive pattern, thereby reducing the manufacturing cost and improving the production yield of the TFT substrate. Further, the capacitance of a storage capacitor may be maximized by reducing the thickness of an insulator between two capacitor electrodes while minimizing the area of overlap between the capacitor electrodes, thereby maximizing the aperture ratio of the corresponding pixel area.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   a gate line;
   a data line crossing the gate line thereby defining pixel area;
   a gate insulating film between the gate and data lines;
   a thin film transistor connected to the gate and data lines;
   a semiconductor layer defining a channel of each thin film transistor;
   a passivation film on the data line and on the thin film transistor;
   a pixel hole corresponding to a pixel area, wherein the pixel hole passes through the passivation film and at least partially through the gate insulating film; and
   a pixel electrode within the pixel hole, wherein a portion of the pixel electrode is on the gate insulating film and overlaps a portion of the gate line to form a storage capacitor,
   wherein a thickness of the gate insulating film outside the pixel hole is greater than a thickness of the gate insulating film on the portion of the gate line forming the storage capacitor within the pixel hole.

2. The device of claim 1, wherein the data line overlaps the semiconductor layer.

3. The device of claim 1, wherein the pixel electrode contacts a side surface of a drain electrode of the thin film transistor.

4. The device of claim 3, further comprising a first contact hole through the gate insulating film.

5. The device of claim 4, wherein the first contact hole is aligned within the pixel hole.

6. The device of claim 1, further comprising:
   a gate pad, the gate pad including a lower gate pad electrode connected to the gate line, and an upper gate pad electrode connected to the lower gate pad electrode.

7. The device of claim 6, further comprising a second contact hole through the gate insulating film and the passivation film.

8. The device of claim 7, wherein the upper gate pad electrode contacts the lower gate pad electrode via the second contact hole.

9. The device of claim 6, wherein the upper gate pad electrode comprises a transparent conductive material.

10. The device of claim 8, wherein the upper gate pad electrode contacts a side surface of the passivation film.

11. The device of claim 1, further comprising:
    a data pad, the data pad including a lower data pad electrode connected to the data line, and an upper data pad electrode connected to the lower data pad electrode.

12. The device of claim 11, further comprising a third contact hole through at least one of the passivation film, the lower data pad electrode, and the semiconductor layer.

13. The device of claim 11, wherein the upper data pad electrode contacts the lower data pad electrode via the third contact hole.

14. The device of claim 11, wherein the upper data pad electrode comprises a transparent conductive material.

15. The device of claim 11, wherein the upper data pad electrode contacts a side surface of the passivation film.

16. The device of claim 1, wherein the pixel electrode comprises a transparent conductive material.

17. The device of claim 1, wherein the pixel electrode contacts a side surface of the passivation film.

18. A method of fabricating a liquid crystal display device, comprising:
    forming a gate metal pattern on a substrate, wherein the gate metal pattern includes a gate line and a gate electrode;
    forming a gate insulating film on the gate metal pattern;
    sequentially forming a semiconductor pattern and a data metal pattern on the gate insulating film, wherein the data metal pattern includes a data line, a source electrode, and a drain electrode;
    forming a passivation film on the data metal pattern;
    forming a pixel hole through the passivation film and at least partially through the gate insulating film, wherein a portion of the drain electrode is exposed by the pixel hole; and
    forming a pixel electrode within the pixel hole, wherein the pixel electrode contacts the exposed portion of the drain electrode, and a portion of the pixel electrode is on the gate insulating film and overlaps a portion of the gate line to form a storage capacitor, and
    wherein a thickness of the gate insulating film outside the pixel hole is greater than a thickness of the gate insulating film on the portion of the gate line forming the storage capacitor within the pixel hole.

19. The method of claim 18, further comprising:
    forming a first contact hole through the gate insulating film, wherein the first contact hole is aligned within the pixel hole.

20. The method of claim 19, wherein forming the first contact hole comprises:
    forming a photo-resist film on the passivation film;
    arranging a resist mask over the photo-resist film;
    photolithographically patterning the photo-resist film using the resist mask to form a photo-resist pattern; and
    etching the gate insulating film using the photo-resist pattern as a mask.

21. The method of claim 20, wherein forming the pixel hole comprises:
    removing a first portion of the photo-resist pattern such that a second portion of the photo-resist pattern remains, thereby partially exposing the passivation film; and
    etching the partially exposed passivation film.

22. The method of claim 21, wherein the first portion of the photo-resist pattern is thinner than the second portion of the photo-resist pattern.

23. The method of claim 21, wherein etching the partially exposed passivation film comprises:
    partially exposing the gate insulating film; and
    etching the partially exposed gate insulating film.

24. The method of claim 21, wherein forming the plurality of pixel electrodes comprises:
    forming a transparent conductive material on the second portion of the photo-resist pattern and within pixel hole; and
    removing the second portion of the photo-resist pattern having the transparent conductive material thereon.

25. The method of claim 20, wherein the resist mask includes a halftone mask.

26. The method of claim 20, wherein the resist mask includes a diffractive exposure mask.

27. The method of claim 20, wherein removing the first portion of the photo-resist pattern includes performing an ashing process after forming the first contact hole.

28. The method of claim 24, wherein the removing the second portion of the photo-resist pattern includes performing a lift-off process.

29. The method of claim 19, further comprising:
forming a lower gate pad electrode simultaneously with the forming of the gate line and gate electrode, wherein the lower gate pad electrode is connected to the gate line;
forming a second contact hole within the gate insulating and passivation films simultaneously with the forming of the first contact hole, wherein at least a portion of the lower gate pad electrode is exposed within the second contact hole; and
forming an upper gate pad electrode within the second contact hole, wherein the upper gate pad electrode contacts the lower gate pad electrode.

30. The method of claim 19, further comprising:
forming a lower data pad electrode using the second mask simultaneously with the formation of the data line and the source and drain electrodes, wherein the lower data pad electrode is connected to a data line and the semiconductor pattern;
forming a third contact hole within at least one of the passivation film, the lower data pad electrode, and the semiconductor pattern simultaneously with the forming of the first contact hole, wherein at least a portion of at least one of the lower data pad electrode and the semiconductor pattern is exposed within the third contact hole; and
forming an upper data pad electrode within the third contact hole, wherein the upper data pad electrode contacts the lower data pad electrode.

31. The method of claim 30, wherein the upper data pad electrode contacts a side surface of the lower data pad electrode.

* * * * *